United States Patent
Crawley et al.

(10) Patent No.: US 7,732,889 B2
(45) Date of Patent: Jun. 8, 2010

(54) CAPACITOR STRUCTURE IN A SEMICONDUCTOR DEVICE

(75) Inventors: Philip John Crawley, Sacramento, CA (US); Sajol Ghoshal, El Dorado Hills, CA (US)

(73) Assignee: Akros Silicon Inc., Folsom, CA (US)

( * ) Notice: Subject to any disclaimer, the term of this patent is extended or adjusted under 35 U.S.C. 154(b) by 323 days.

(21) Appl. No.: 11/753,524

(22) Filed: May 24, 2007

(65) Prior Publication Data

US 2008/0290444 A1 Nov. 27, 2008

(51) Int. Cl.
H01L 21/76 (2006.01)

(52) U.S. Cl. .............. 257/499; 257/503; 257/532; 257/501; 257/506; 257/446; 257/307; 257/508; 257/535; 257/E29.001; 257/E21.008; 257/E29.342; 257/E29.343; 257/E21.54; 257/E21.574; 257/E21.628; 438/393

(58) Field of Classification Search .................. None
See application file for complete search history.

(56) References Cited

U.S. PATENT DOCUMENTS

| | | | |
|---|---|---|---|
| 5,652,585 A | 7/1997 | Leung et al. | |
| 6,297,755 B2 | 10/2001 | Scott et al. | |
| 6,331,785 B1 | 12/2001 | Swanson et al. | |
| 6,369,738 B1 | 4/2002 | Swanson | |
| 6,445,791 B1 | 9/2002 | Grisamore et al. | |
| 6,459,323 B2 | 10/2002 | Birkeli | |
| 6,690,055 B1 * | 2/2004 | Uhlenbrock et al. | 257/310 |
| 6,724,891 B1 | 4/2004 | Huang et al. | |
| 6,819,169 B1 | 11/2004 | Kunc et al. | |
| 7,072,389 B2 | 7/2006 | Scott et al. | |
| 2005/0017321 A1 * | 1/2005 | Hakkarainen et al. | 257/532 |
| 2005/0082586 A1 * | 4/2005 | Tu et al. | 257/296 |
| 2006/0138595 A1 * | 6/2006 | Kiyotoshi | 257/532 |
| 2008/0251889 A1 * | 10/2008 | Tsao et al. | 257/532 |

* cited by examiner

*Primary Examiner*—Minh-Loan T Tran
*Assistant Examiner*—Fei Fei Yeung Lopez

(57) ABSTRACT

A semiconductor device comprises an integrated circuit formed on a substrate with a signal interface and at least one isolator capacitor. The integrated circuit comprises a plurality of interleaved inter-metal dielectric layers and interlayer dielectrics formed on the substrate, a thick passivation layer formed on the plurality of the interleaved inter-metal dielectric layers and interlayer dielectrics, and a thick metal layer formed on the thick passivation layer. The thick passivation layer has a thickness selected to be greater than the isolation thickness whereby testing for defects is eliminated. The one or more isolator capacitors comprise the thick metal layer and a metal layer in the plurality of interleaved inter-metal dielectric layers and interlayer dielectrics separated by the thick passivation layer as an insulator.

44 Claims, 24 Drawing Sheets

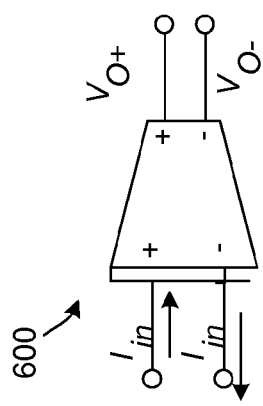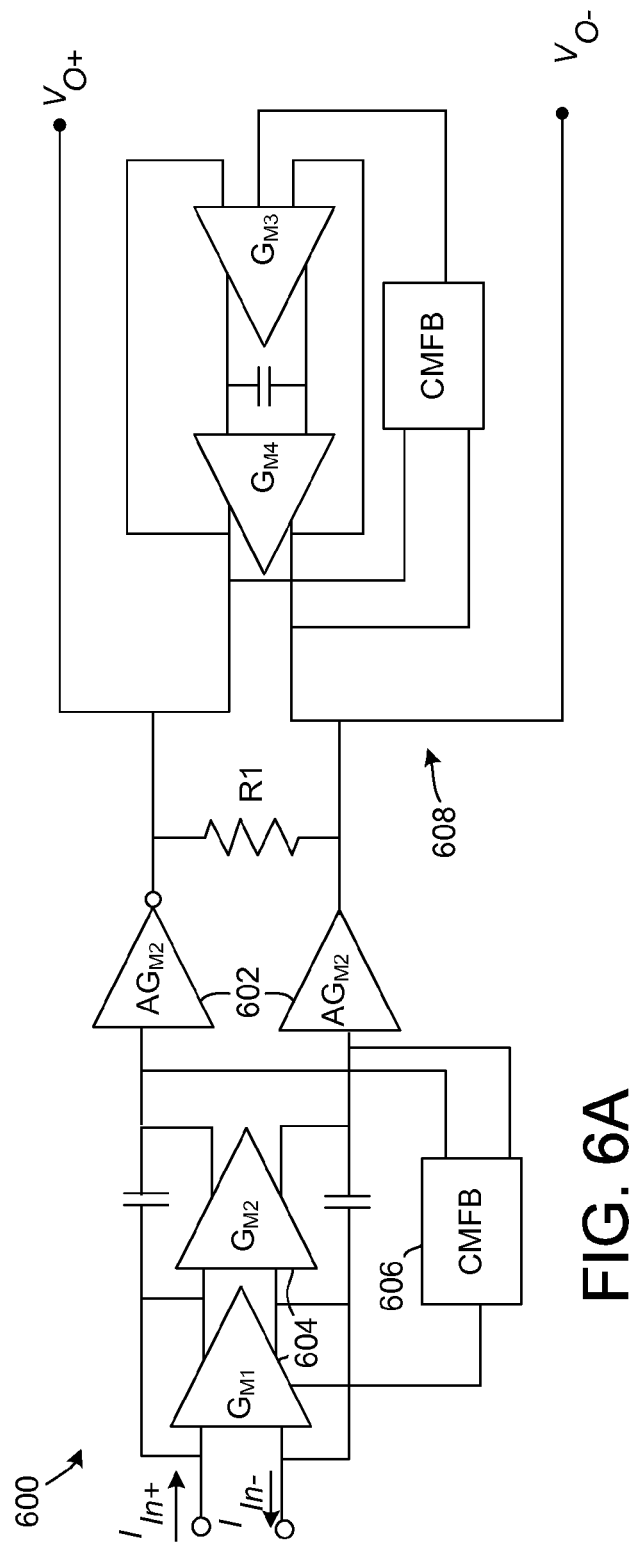
FIG. 6B
FIG. 6A

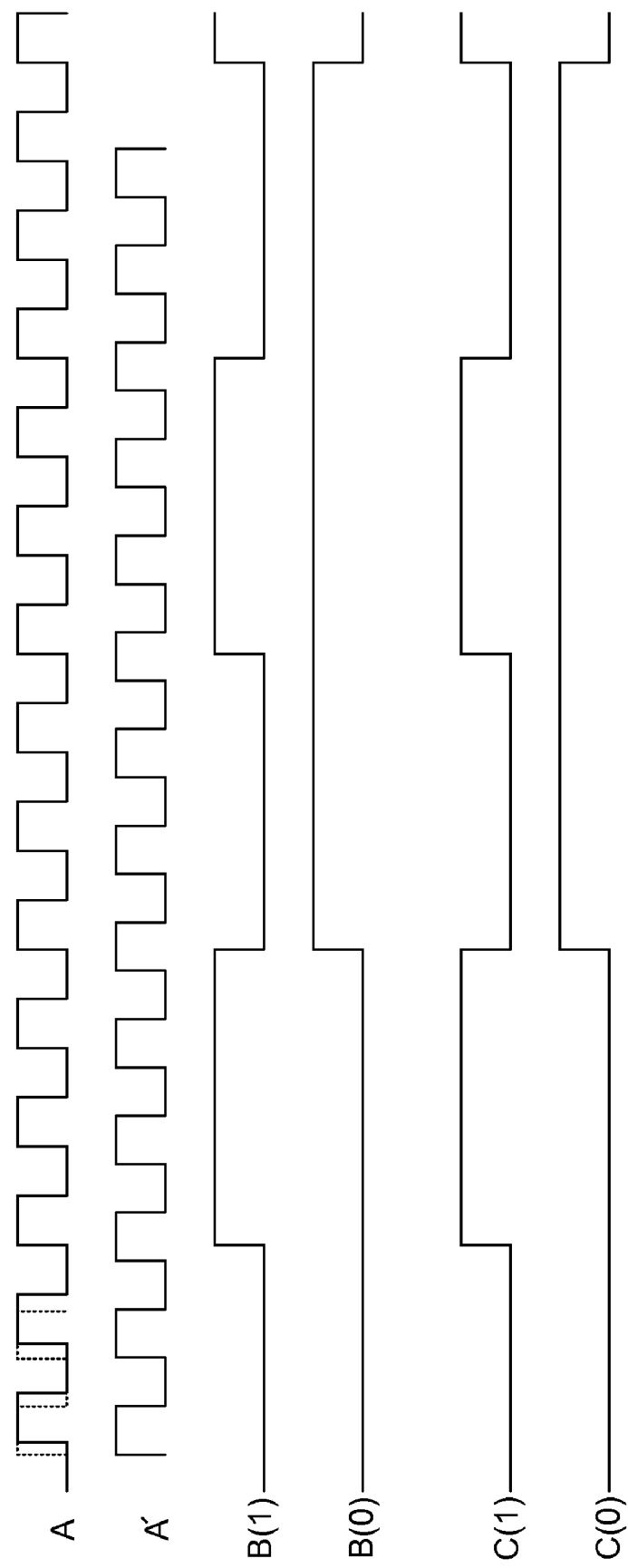

FIG. 13A

Output signal due to differential edge

Output due to CM test with worst-case capacitor mismatch

VOLTAGE

FIG. 13B

50kV/usec slew test

VOLTAGE

FIG. 13C

Differential input drive

VOLTAGE

CAPACITOR STRUCTURE IN A SEMICONDUCTOR DEVICE

BACKGROUND

Various communications, medical, computing, industrial, and other systems implement isolation barriers to electrically isolate sections of electronic circuitry. An isolator is a device that can transfer a signal between sections of electronic circuitry while maintaining electrical isolation between the sections.

A typical conventional design attains isolation, for example, by connecting to a communication channel through a transformer. The transformer provides isolation both for surge and galvanic isolation. Power can be transmitted on the line through the transformer.

SUMMARY

According to an embodiment of a semiconductor device, an integrated circuit is formed on a substrate with a signal interface and at least one isolator capacitor. The integrated circuit comprises a plurality of interleaved inter-metal dielectric layers and interlayer dielectrics formed on the substrate, a thick passivation layer formed on the plurality of the interleaved inter-metal dielectric layers and interlayer dielectrics, and a thick metal layer formed on the thick passivation layer. The thick passivation layer has a thickness selected to be greater than the isolation thickness whereby testing for defects is eliminated. The one or more isolator capacitors comprise the thick metal layer and a metal layer in the plurality of interleaved inter-metal dielectric layers and interlayer dielectrics separated by the thick passivation layer as an insulator.

BRIEF DESCRIPTION OF THE DRAWINGS

Embodiments of the invention relating to both structure and method of operation may best be understood by referring to the following description and accompanying drawings:

FIGS. 6A and 6B are a schematic circuit and block diagram and a symbolic representation showing an embodiment of a differentiator that can be used in the signal interface;

FIG. 10C is a set of time waveforms depicting digital signals at several locations in the digital isolator;

FIGS. 13A, 13B, and 13C are a set of time waveforms illustrating aspects of operation of a first differentiator output signal.

DETAILED DESCRIPTION

Figure 1A:
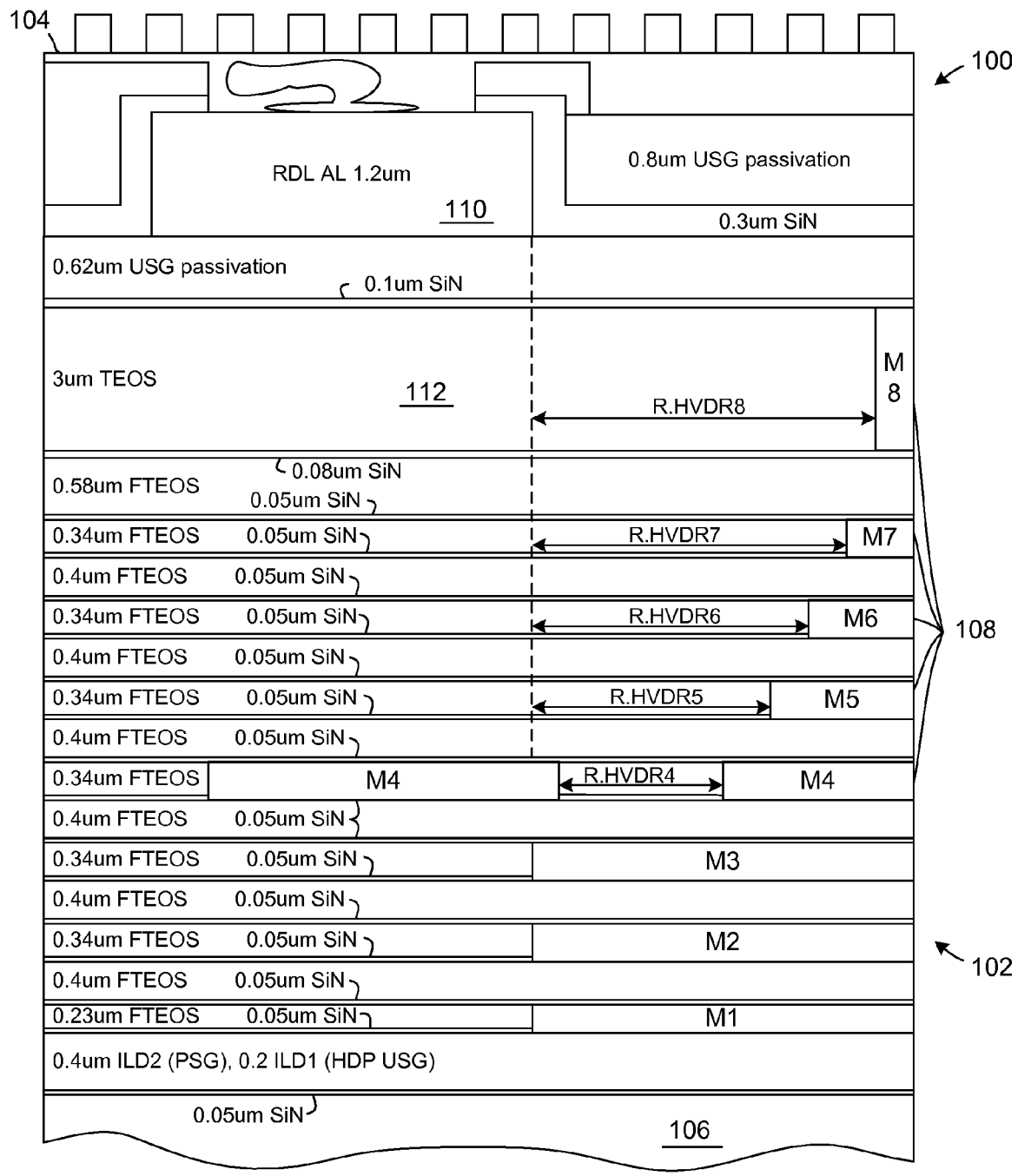
FIGS. 1A, 1B, and 1C are several cross-sectional views depicting an embodiment of a semiconductor device including a metal stack that can be used for implementing the illustrative signal isolators including integration of capacitors.
Figure 1B:
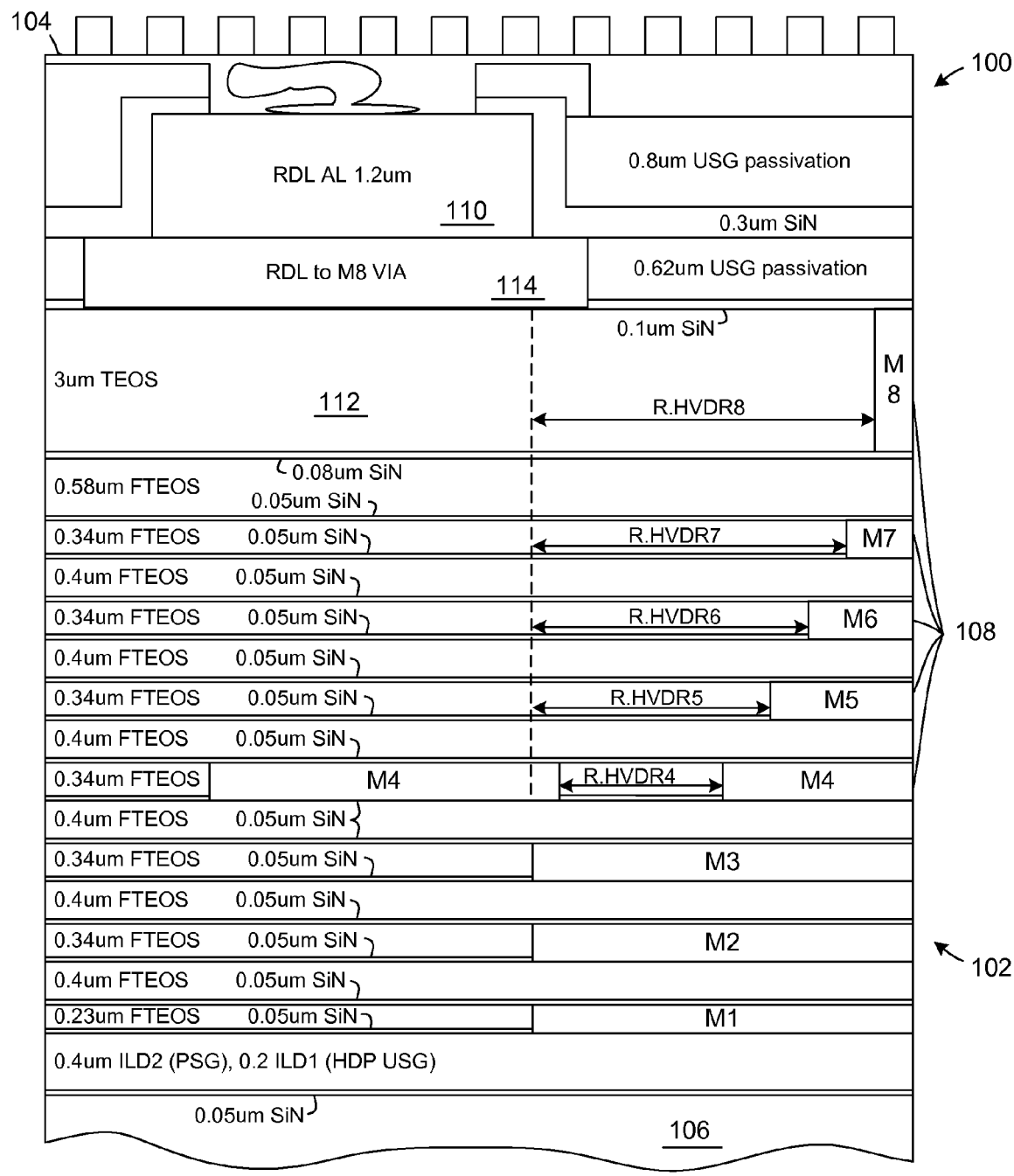
Figure 1C:
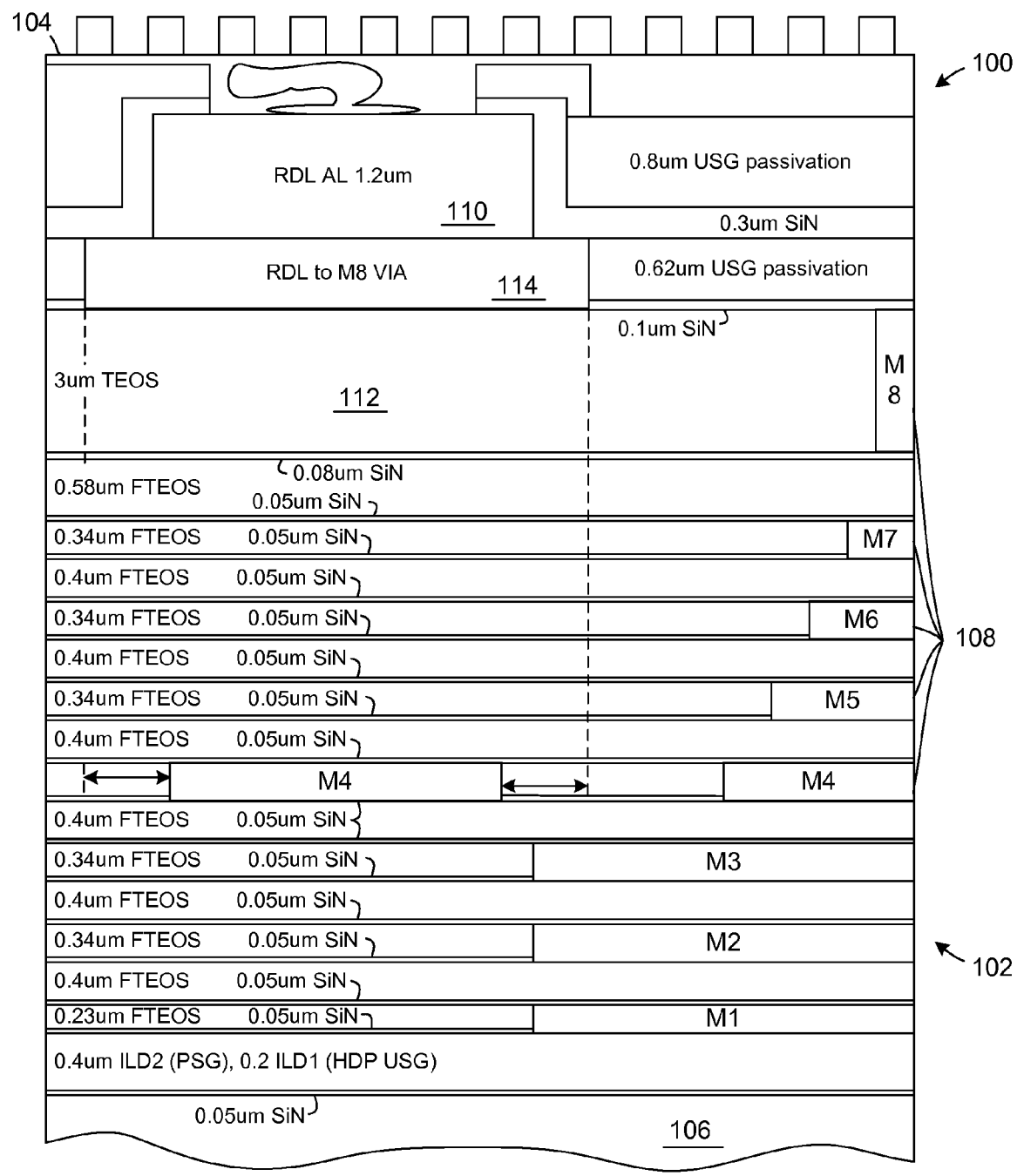

Referring to FIGS. 1A, 1B, and 1C, several cross-sectional views depict an embodiment of a semiconductor device 100 that can be used for implementing the illustrative signal isolators including integration of capacitors. The semiconductor device 100 comprises an integrated circuit 104 formed on a substrate 106 and has a signal interface with one or more isolator capacitors. The integrated circuit 104 comprises multiple interleaved inter-metal dielectric layers and interlayer dielectrics 108 formed on the substrate 106, a thick passivation layer 112 formed on the multiple interleaved inter-metal dielectric layers and interlayer dielectrics 108, and a thick metal layer 110 formed on the thick passivation layer 112. The thick passivation layer 112 has a thickness selected to be greater than the thickness warranted for sufficient isolation so that testing for detects can be eliminated. The one or more isolator capacitors are formed by the thick metal layer 110 and a metal layer in the multiple interleaved inter-metal dielectric layers and interlayer dielectrics 108 separated by the thick passivation layer 112 as an insulator. The increased thickness of the passivation layer 112 results in elimination or reduction of parasitic capacitance because a higher layer or level of metal can be used for a bottom plate of the capacitor, for example metal layer M4. Without the thick passivation layer 112, a much lower layer of metal or polysilicon might be used, for example M1, to attain sufficient isolation.

In some embodiments, the integrated circuit 104 comprising multiple interleaved inter-metal dielectric layers and interlayer dielectrics 108 in a stack 102 formed on the substrate 106, a thick passivation layer 110 formed on the metal and dielectric layer stack 102, and a thick metal layer 110 formed on the thick passivation layer 112. Multiple isolator capacitors can be formed on separate dies and configured with a reduced ratio of parasitic capacitance to primary capacitance since only a fraction of the isolation is allocated to each die.

In a particular implementation, isolator capacitors can be configured with the thick passivation layer 112 functioning as an insulator with a thickness that is selected to reduce parasitic capacitance by enabling the lower metal plate of the capacitor to be located on a higher level or layer of metal. Passivation layer thickness can further be selected to improve high-speed operation of the interface.

The integrated circuit 104 can be implemented using standard processing to construct the substrate 106, the multiple interleaved inter-metal dielectric layers and interlayer dielectrics 108, the thick passivation layer 112, and the thick metal layer 110. However, improvements in performance can be attained by constructing the integrated circuit 104 so that the thickness of the thick passivation layer 112 is selected to be larger than for standard processing to reduce the impact of oxide defects. The increased thickness of the thick passivation layer 112 can enable elimination or minimization of usage of high-voltage production testing, if sufficient margin is included in the design. For example for an isolation specification of $1500V_{RMS}$ for one minute such as dictated in Institute of Electrical and Electronics Engineers (IEEE) 802.3, the oxide on each die supports $1500V_{RMS}$, so that even if one of the two capacitor fails, isolation support is still maintained. In practice the effect of margin is more distributed, but achieves the same result of removing the need for isolation testing.

In an example embodiment, the integrated circuit 104 can be configured with the multiple interleaved inter-metal dielectric layers and interlayer dielectrics 108 distributed within silicate glass dielectric layers, separated by thin silicon nitride layers and overlying inter-layer dielectric layers. The thick metal layer 110 can be a redistribution layer (RDL) with the thick passivation layer 112 constructed as an undoped silicate glass (USG) layer.

The illustrative semiconductor device 100 comprises an integrated circuit 104 formed on a substrate 106 and includes a signal interface with at least one isolator capacitor. The integrated circuit 104 comprises multiple interleaved inter-metal dielectric layers and interlayer dielectrics 108 formed on the substrate 106, a thick metal layer 110 formed on the multiple interleaved inter-metal dielectric layers and interlayer dielectrics 108, and a passivation layer 112 formed on the thick metal layer 110. The one or more isolator capacitors can be configured to use the thick oxide layer as an insulator whereby thickness of the oxide layer is selected to reduce parasitic capacitance. The passivation layer 112 can be formed from tetra-ethyl-ortho-silicate (TEOS) oxide, P-doped silicate glass (PSG), thick oxide, or other suitable materials.

The illustrative semiconductor structure enables capacitor matching. The thick metal layer 110 can be used for the complementary metal-oxide semiconductor (CMOS) processes for radio frequency inductors and typically have a thickness of 2-3 microns although any suitable thickness may be appropriate for a particular structure or application. In the illustrative integration, the thick metal 110 is present due to usage for the inductors and the passivation layer 112 is also available, a condition which can be exploited for usage in forming isolation capacitors. The integrated circuit 104 can also include a redistribution layer (RDL) overlying the passivation layer 112 which can be an extra thick and high quality layer. The combination of the metal stack and passivation layer 112 can be configured in combination to form capacitors with a low level of parasitic capacitance and that facilitate high-speed operation. For example, the capacitors can be formed from metal layers positioned adjacent and on the two sides of the passivation layer 112, enabling construction of a high-speed isolator. Reduced-size capacitors that can be formed using the illustrative metal layers and passivation layer 112 and generally, the smaller the capacitors, the more easily a high-speed circuit can be attained without consuming an inordinate amount of power.

Figure 9:
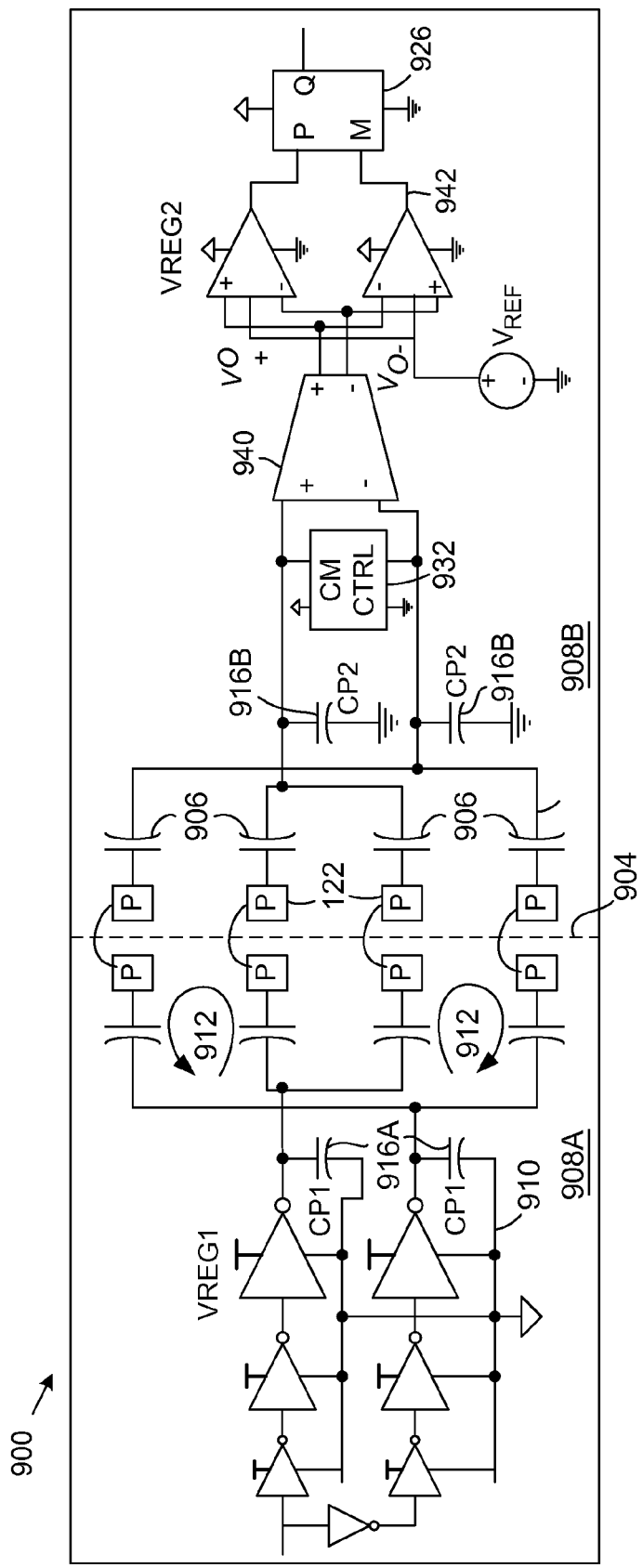
FIG. 9 is a schematic circuit diagram showing an embodiment of a signal isolator that implements process tracking enabling high-speed performance for the differentiator.

The illustrative process enables a lower parasitic capacitance, for example as shown for capacitance at the input current to the differentiator 600 in FIG. 6A and the parasitic capacitance CP1 at the transmitter 924 in the isolation interface 900 in FIG. 9. The small capacitors enable high-speed operation since large capacitors make difficult a high-speed implementation.

The illustrative integrated circuit 104 can be formed using a digital process which is standard for example for radio frequency circuits. The integrated circuit 104 can otherwise be constructed by creating additional distribution layers for building the oxides at the possible detriment to reliability. By forming offset layers as a part of a standard process inherently helps to mitigate variation in the layers since in a nonstandard process, each layer introduces an independent variable in processing so that overall oxide thickness can be variable.

Another possible disadvantage of a nonstandard process is the risk of introducing defects in the oxide layers that can limit reliability. If a defect exists in the oxide, a capacitor can fail. To enhance reliability, the standard process can be used to construct an extra thick oxide layer, for example an oxide layer with thickness greater than specified by the standard, thereby increasing reliability in parallel with improving high-speed performance. The increased reliability attained by forming a thicker oxide layer avoids the impact of defects and enables a reduction in testing and the expenses of testing.

The capacitors formed on a single wafer can be split into two dies, enabling improvement in high-speed isolator performance by reducing the ratio of parasitic capacitance to primary capacitance. Increasing the thickness of the oxide layer also reduces the ratio of parasitic capacitance to primary capacitance.

The metal stack 102 can be formed of multiple metal layers in interleaved inter-metal dielectric layers and interlayer dielectrics 108, for example distributed within multiple silicate glass dielectric layers, for example formed from tetra-ethyl-ortho-silicate (TEOS) and fluorine-doped TEOS (FTEOS) separated by thin silicon nitride (SiN) layers, and overlying inter-layer dielectric layers (ILD1, ILD2) that function as an insulator to separate two or more conductive layers.

FIG. 1A shows processing of the metal stack 102 and thick metal layer 110 and passivation 112 that can be used to construct capacitors. In an illustrative embodiment, the thick metal layer 110 can be a redistribution layer with a metal via 114 formed beneath the RDL preventing deposition of undesirable passivation material. FIG. 1B illustrates an RDL metal via 114 to one or more metal layers, for example layer M8. The via 114 is shown under the RDL metal layer 110, locally replacing the passivation layer 112, a design rule violation that facilitates or enables operation of the capacitor.

Metal vias 114 can be formed to prevent deposition of materials with unfavorable breakdown voltages. In various applications, arrangements, and/or embodiments, metal vias 114 for preventing material deposition can be formed in association with the thick metal layer 110 and metal layers within the stack 102, or independent of either or both metal layers.

One or more metal layers selected formed among the multiple interleaved inter-metal dielectric layers and interlayer dielectrics 108 can be formed underlying the metal via 114 to extend laterally so that the lateral extension of the metal via 114 overlaps the metal layer or layers. FIG. 1C shows formation of the via 114 in an arrangement that overlaps metal layer M4, preventing or reducing a fringing effect.

Figure 1D:
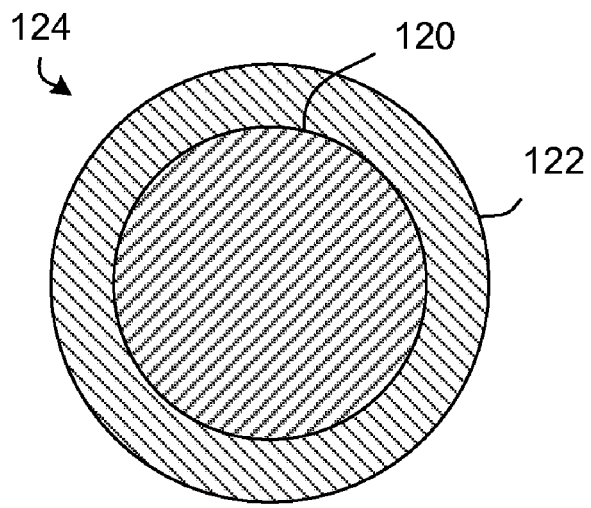
FIGS. 1D and 1E are schematic pictorial views showing arrangement of metal plates in embodiments of isolation capacitors.
Figure 1E:
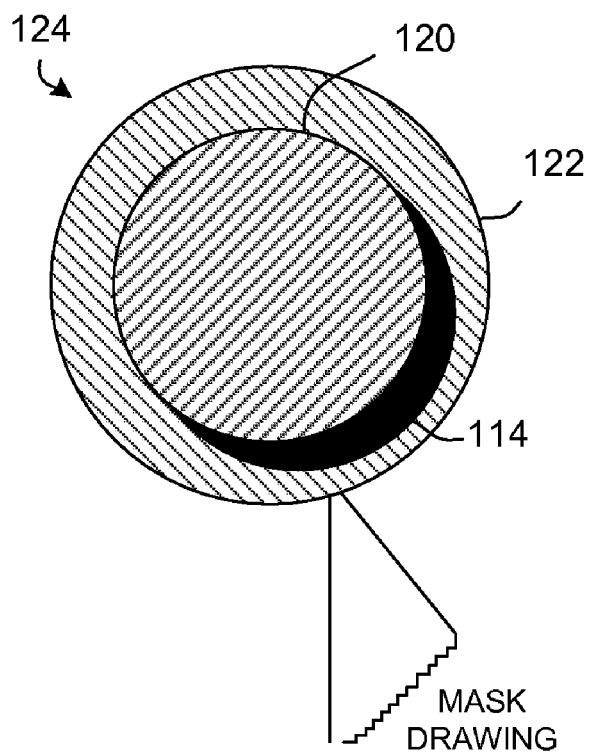

Referring to FIG. 1D, a schematic pictorial view shows an arrangement of first 120 and second 122 metal plates for an isolation capacitor 124 with the first plate 120 smaller than the second plate 122. In an example embodiment, the first plate 120 can be a top plate, and the second plate 122 a bottom plate. FIG. 1E is a pictorial view depicting a top plate 120 larger than a bottom plate 122 with a metal via 114 offset from the bottom plate 122. In an illustrative embodiment, the thick metal layer 110 can be functional as the first plate 120 and a predetermined metal layer, for example M4, in the interleaved inter-metal dielectric layers and interlayer dielectrics 108 functional as the second plate 122 in the isolation capacitor 124. The first plate 120 and the second plate 122 can be arranged as substantially parallel planes extending laterally with an overlap selected to compensate for dielectric leakage and fringe fields from creating voltage gradients.

In some embodiments, the first plate 120 and the second plate 122 can be formed with rounded or oblique angles so that electric fields and/or voltage gradients are reduced or minimized.

Figure 2:
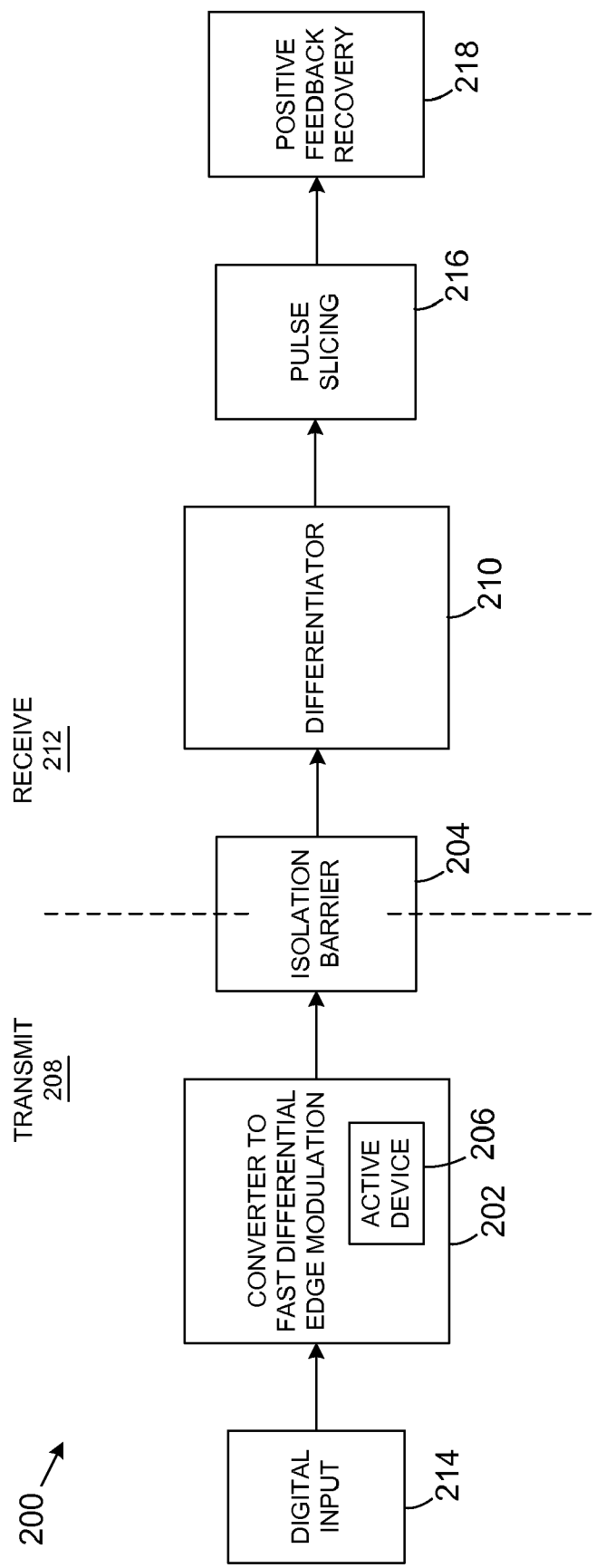
FIG. 2 is a schematic block diagram illustrating an embodiment of an interface that can be implemented to operate a high speeds, for example in the gigabit per second range.

Referring to FIG. 2, a schematic block diagram illustrates an embodiment of an interface 200 that can be implemented to operate a high speeds, for example in the gigabit per second range. The interface 200 comprises a converter 202 that is configured to track process characteristics across an isolation barrier 204 and modify the amplitude of a fast differential edge modulation as a function of the speed of an active device 206 on a transmitting side 208 of the isolation barrier 204. The interface 200 also has a differentiator 210 that is configured to differentiate the fast differential edge modulation on the receiving side 212 of the isolation barrier 204 whereby differentiation bandwidth tracks slope rate of the differential edge modulation.

A digital input signal is converted to a fast differential edge modulation that tracks process characteristics across the isolation barrier 204. For example, process characteristics can be selected to track by incorporating integrated circuits on the two sides of the isolation barrier that are cut from the same processed semiconductor wafer.

FIG. 2 is a high-level block diagram depicting general elements of an embodiment of an isolator interface 200 that can be implemented as a high-speed isolator but may be used in other applications. The interface 200 is operative to perform information communication across an isolation barrier 204 by a modulation technique which converts an information signal to a digital signal containing all information in the information signal in an edge of a single transition.

In some embodiments, the interface 200 can have a capacitive isolation barrier 204 coupled between the converter 202 and the differentiator 210 that is operative for passing the fast differential edge modulation. The converter 202 and differentiator 210 can be configured for tracking the differentiation bandwidth and slope rate of the differential edge modulation whereby capacitor size in the isolation barrier 204 is reduced or minimized and low frequency components in the passed fast differential edge modulation are attenuated so that common mode noise is rejected. Common-mode noise between the two sides of the isolation is converted into differential error due to capacitor mismatch, which could create an error whereby the receiver interprets the noise as data. In general, external noises between the grounds that are large (1-2 kV) have less bandwidth than the internally generated differential signal. Differentiation tends to suppress the external signal relative to the internal signals. Faster, external signal that are smaller in amplitude are rejected by the differential nature of the circuit.

The interface 200 is configured for transmitting a signal through the isolation barrier 204 by converting a digital signal to a fast differential edge modulation that tracks process characteristics across the isolation barrier 204 and passes the fast differential edge modulation through the isolation barrier 204. The fast differential edge modulation that is passed through the isolation barrier 204 is differentiated to form a pulse according to a transfer function that amplifies the pulse.

Process characteristics across the isolation barrier can be tracked by modifying the amplitude of the fast differential edge modulation as a function of speed of an active device 206 on a transmitting side 208 of the isolation barrier 204.

The edge rate and amplitude of the fast differential edge modulation is controlled to characterize information in the digital signal.

In embodiments that pass the fast differential edge modulation through a capacitive isolation barrier, the fast differential edge modulation that is passed through the isolation barrier 204 is differentiated to form the pulse according to a transfer function that amplifies the pulse whereby capacitor size in the isolation barrier is reduced or minimized.

Figure 3A:
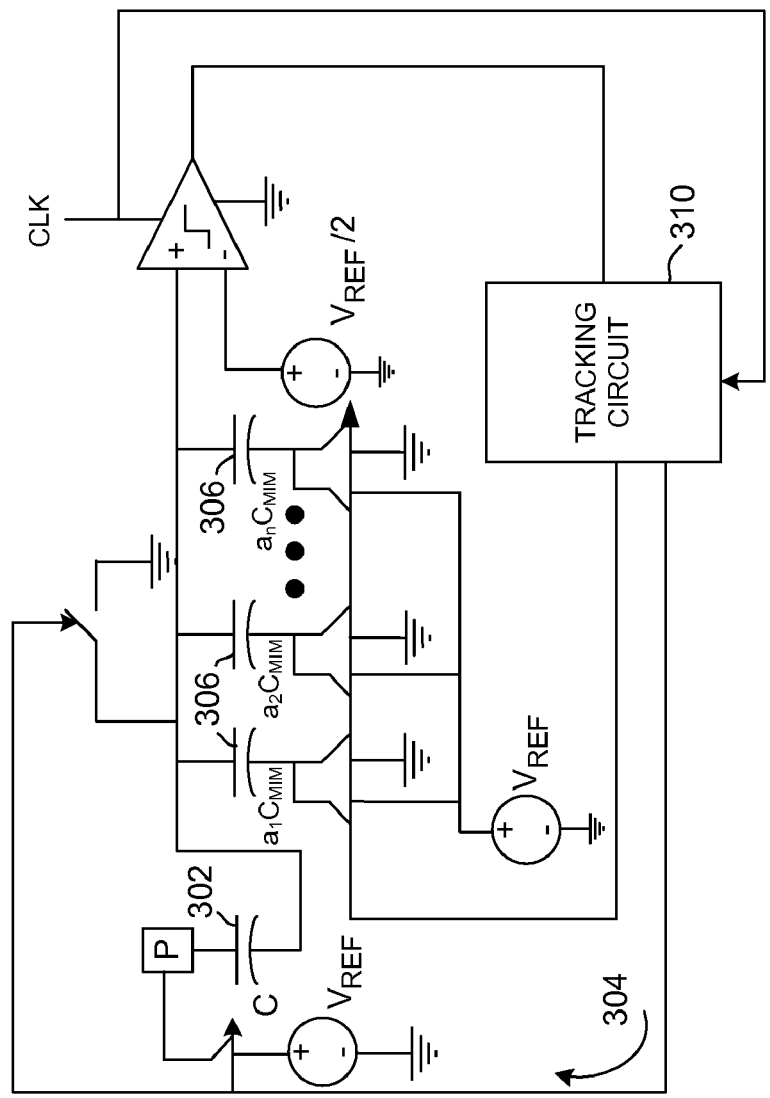
FIG. 3A is a schematic circuit diagram showing an embodiment of a capacitive calibration circuit used to calibrate a capacitor such that the differentiator bandwidth tracks process.
Figure 3A:
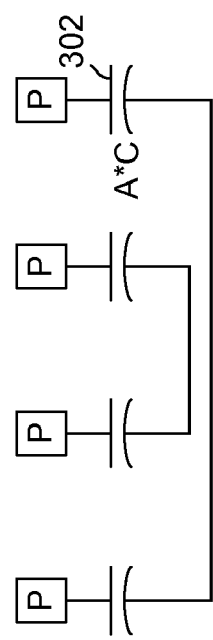

Referring to FIG. 3A in combination with FIG. 2, in some embodiments the interface 200 can be implemented with a capacitive isolation barrier 204 coupled between the converter 202 and the differentiator 210 that comprises multiple inter-level metal dielectric (IMD) capacitors 302. A feedback control loop 304 can be configured to match a metal-insulator-metal (MIM) capacitor 306 to the IMD capacitors 302 so that differential bandwidth tracks over process variations.

In some implementations, the capacitive isolation barrier 204 can comprise a multiple inter-level metal dielectric (IMD) capacitors 302 formed on first and second sides of the isolation barrier 204 from respective separate first and second integrated circuit dies cut from adjacent portions of a common wafer.

The fast differential edge modulation is passed through the capacitive isolation barrier 204 which can be implemented as multiple inter-level metal dielectric capacitors 302 formed on both sides of the isolation barrier 204 that can be constructed from respective separate first and second integrated circuit dies from adjacent portions of the common wafer.

The fast differential edge modulation can be passed through the capacitive isolation barrier 204 constructed from multiple inter-level metal dielectric (IMD) capacitors 302. A metal-insulator-metal (MIM) capacitor 306 can be matched to the inter-level dielectric capacitors 302 by feedback control so that differential bandwidth tracks over process variations.

Figure 3B:
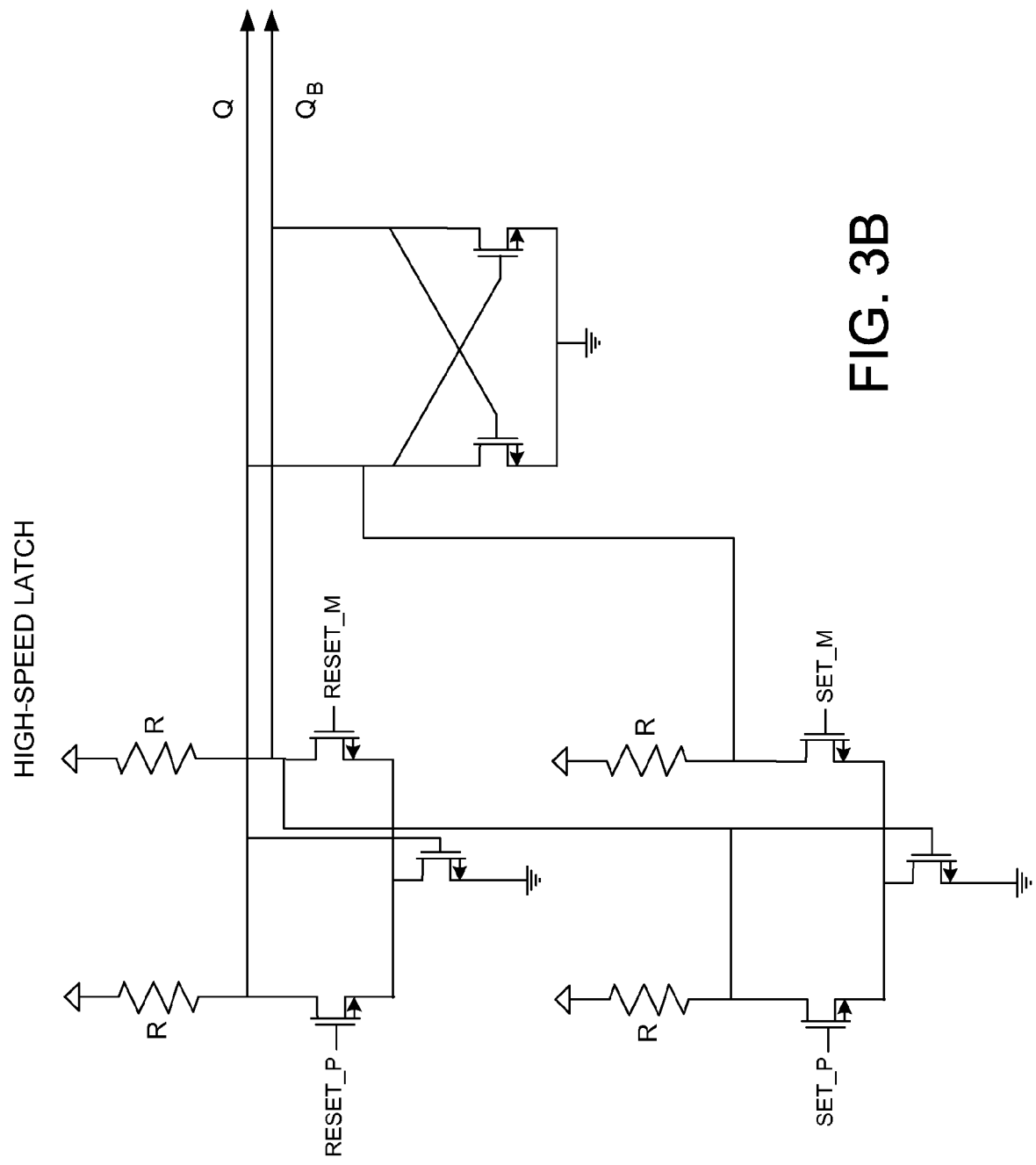
FIG. 3B is a circuit diagram depicting an embodiment of a positive feedback recovery circuit that can be used to reclaim a digital signal from a sliced pulse signal.

Referring to FIG. 3B, a circuit diagram depicts an embodiment of a positive feedback recovery circuit including a high-speed latch that can be used to reclaim a digital signal from a sliced pulse signal. A high-speed positive feedback signal can be used to recover the digital data at the output of the slicer. An N-channel metal-oxide semiconductor (NMOS)-only design can be used to ensure the fastest possible bandwidth with the least possibility of meta-stability.

Referring again to FIG. 2, another embodiment of the signal interface 200 can comprise an isolation barrier 204, a converter 202, and a differentiator 210. The converter 202 is coupled to a transmitting side 208 of the isolation barrier 204 and configured for receiving a digital signal and converting the digital signal to a fast differential edge modulation that tracks process characteristics across the isolation barrier 204. The differentiator 210 coupled to a receiving side 212 of the isolation barrier 204 and configured for receiving the fast differential edge modulation passed through the isolation barrier 204 and differentiating the passed fast differential edge modulation to form a pulse according to a transfer function that amplifies the pulse.

The converter 202 is configured for controlling edge rate and amplitude of the fast differential edge modulation to characterize information in the digital signal.

Typically, the differentiator 210 can be a first or second order differentiator, although any suitable differentiator or high-pass/bandpass filter may be incorporated into the signal interface 200.

The isolation barrier 204 can be a capacitive isolation barrier that passes the fast differential edge modulation. The differentiator 210 can be configured for differentiating the passed fast differential edge modulation and forming a pulse according to a transfer function that amplifies the pulse whereby capacitor size in the isolation barrier 204 is reduced or minimized.

Referring to FIGS. 1A, 1B, and 1C in combination with FIGS. 2 and 3A, the integrated circuit 104 can be divided into two dies arranged across the isolation barrier 204 wherein capacitors 302, 306 respectively formed on separate dies are configured with a reduced ratio of parasitic capacitance to primary capacitance.

For example, the integrated circuit 104 can be divided into two or more dies where adjacent dies from the integrated circuit 104 are arranged across the isolation barrier 204 and capacitors 302, 306 are matched.

In another example implementation, the integrated circuit 104 can be divided into two or more dies where adjacent dies from the integrated circuit 104 are arranged across an isolation barrier 204. A capacitor 302, 306 can be a combination of two parts, for example halves, with the different capacitor parts formed on different dies but constructed from the same wafer with matched characteristics.

The semiconductor device 100 can be implemented with the integrated circuit 104 divided into first 208 and second 212 dies and an isolation barrier 204 formed between the first 208 and second 212 dies. Multiple capacitors 302, 306 can be formed on separate dies. A converter 202 in the first die 208 can be configured to track process characteristics across the isolation barrier 204 and modify the amplitude of a fast differential edge modulation as a function of speed of an active device on a transmitting side of the isolation barrier 204. A differentiator 210 in the second die 212 can be configured to differentiate the fast differential edge modulation on a receiving side 212 of the isolation barrier 204 so that differentiation bandwidth tracks slope rate of the differential edge modulation.

In an example implementation, the differentiator 210 can include a calibrated capacitor that matches the capacitors 302, 306.

In another example embodiment, the semiconductor device 100 can be constructed which includes a capacitive isolation barrier 204 coupled between the converter 202 and the differentiator 210 that passes a fast differential edge modulation. The converter 202 and differentiator 210 track the differentiation bandwidth and slope rate of the differential edge modulation to enable capacitor size in the isolation barrier to be reduced or minimized. Low frequency components in the passed fast differential edge modulation are attenuated and common mode noise is reduced.

In another example embodiment, the semiconductor device 100 can further include a capacitive isolation barrier 204 coupled between the converter 202 and the differentiator 210 constructed to include multiple inter-level metal dielectric capacitors 302. A feedback control loop can be used to balance the plurality of inter-level metal dielectric capacitors 302.

The capacitive isolation barrier 204 can be formed with multiple inter-level metal dielectric capacitors 302 formed on first 208 and second 212 sides of the isolation barrier 204 from respective separate first and second integrated circuit dies from adjacent portions of a common wafer.

Figure 4A:
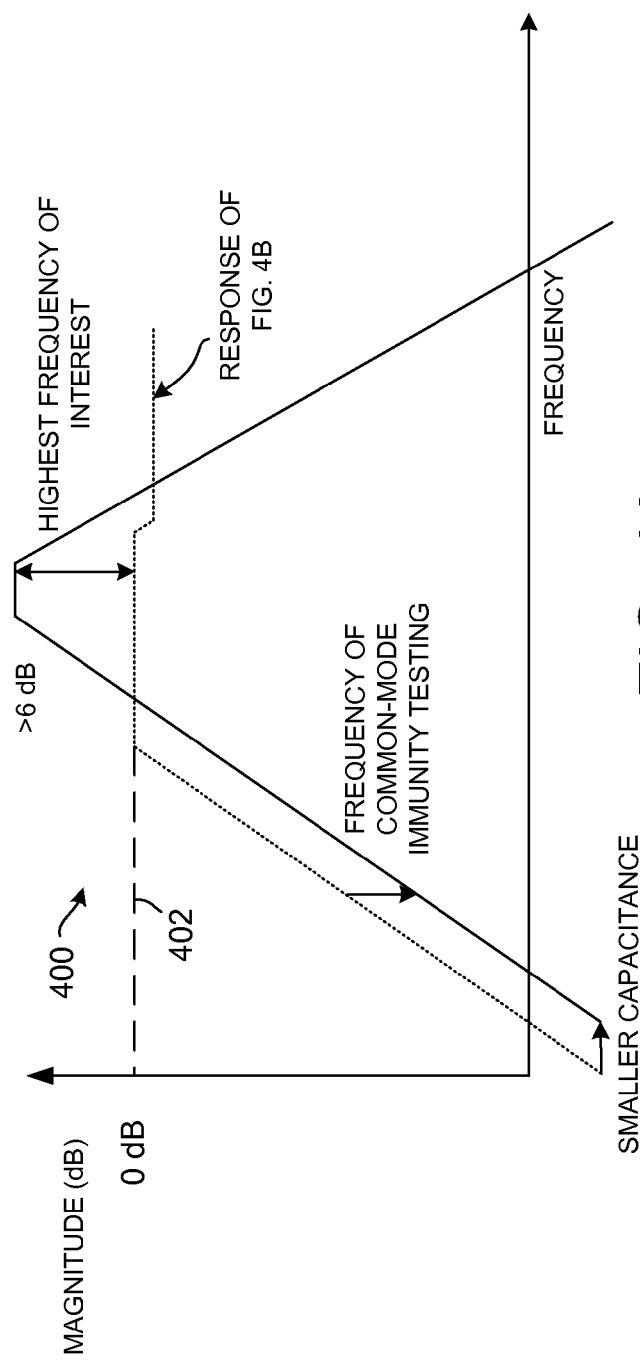
FIGS. 4A, 4B, and 4C respectively depict a schematic graph, a circuit diagram of a typical implementation, and a block diagram illustrating a system using a differentiator and associated technique for amplifying the pulse to reduce capacitor size in the isolation barrier.
Figure 4C:
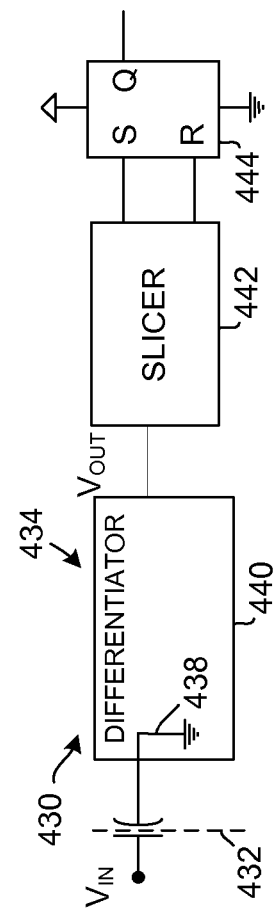
Figure 4B:
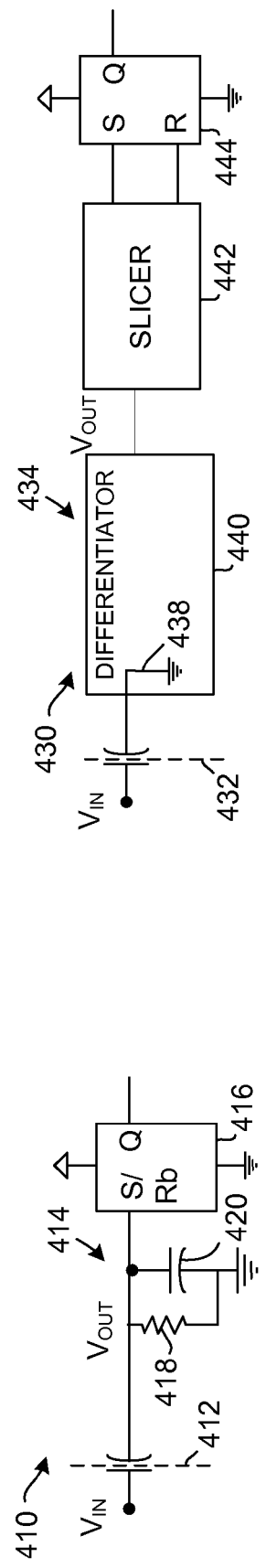

For example, referring to FIGS. 4A, 4B, and 4C, a schematic graph, a circuit diagram showing a more typical implementation, and a block diagram illustrating a system using a differentiator respectively show a technique for amplifying the pulse to reduce capacitor size in the isolation barrier.

FIG. 4B depicts a typical capacitive isolation arrangement 410 with a digital input voltage $V_{IN}$ that is passed across the capacitive isolation 412 to a receiver side 414 as an output voltage $V_{OUT}$. Usually the receiver 414 has either a clocked or an asynchronous flip-flop 416 tied to the output line of the capacitor 412. Implicitly or explicitly, the receiver side 414 includes a resistor 418, a capacitor 420, or both. Referring to the frequency response graph 400 shown in FIG. 4A, the frequency response of the typical isolation arrangement 410 is attenuated as shown in dashed line 402 due to ac-coupling of low frequency signal components, causing gain to flatten once the capacitor 420 becomes a short-circuit in comparison to the circuit path formed by the resistor 418. At higher frequencies, the typical arrangement 410 can only attain a maximum gain of 0 dB. Depending on the parasitic capacitance of the receiver side 414, the signal can be slightly attenuated.

Frequency response performance of the typical isolation arrangement 410 can be insufficient to meet desired common-mode immunity frequency testing specifications unless very large capacitors are used to ensure good matching. Signals passed over the isolation barrier can include components at frequencies near the highest frequency of interest of a digital switching event. The illustrative isolation arrangement 430 including a differentiator 440 as shown in FIG. 4C enables amplification of the signal passed through the isolation barrier in comparison to the typical isolation arrangement 410. The signal is passed through the capacitor 432 to a small signal ground 438 and the differentiator 440. The differentiator 440 produces a pulse so that the isolation arrangement 430 has a transfer function that includes amplification. At the highest frequency of interest, the isolation arrangement 430 has substantially more gain than the typical isolation arrangement 410 and enables the size of the capacitor 432 to be reduced in comparison to capacitor 412 in the typical arrangement 410. A reduced capacitor size decreases the common mode noise by reducing the gain at lower frequencies, thus attenuating common mode movement between ground potentials on the two sides of the isolation barrier. Reducing the size of the capacitor 432 attenuates common mode noise because the high gain is only maintained at the highest frequency of interest for the passed signal, a direct result from processing on the receiving side 434 of the isolation barrier including differentiating. The slope can be controlled on the transmitter so that the amplitude of the passed signal coincides is relatively constant at the output terminal of the differentiator 434. The differentiated signal is passed to the slicer 342 and then to the recovery circuit 444 that can be a set/reset (S/R) flip/flop in an implementation that is fully differential and balanced.

Accordingly, the illustrative isolation arrangement 430 functions more as a communication channel than simply an isolation capacitor with the addition of gain and enhanced handling of the passed signal. The illustrative isolation arrangement 430, overall architecture, and corresponding operating technique take a digital input signal and convert the signal to more of an analog-type signal through isolation and differentiation. Thus the isolation arrangement 430 functions in an analogous manner to a digital-to-analog conversion then an analog-to-digital conversion, or in essence a one-bit digital to analog converter or digital-to-slope converter followed by a slope-to-digital converter. Using the isolation barrier as a communication channel enables much higher bandwidths to be attained. Common-mode noise can be addressed as an impairment to develop a higher bandwidth as defined by Shannon information transmission capacity according to Equation (1):

$$C = W \log_2(S/N+1), \qquad (1)$$

where W is channel bandwidth, S is signal power and N is noise power which is primarily a common-mode error term. Although the depicted embodiment only shows one configuration, the concept can be extended using communication theory techniques, such as trellis coding and decoding and other error correction techniques to increase channel capacity. For example, multiple-slope transmission and reception can be implemented so that a change in the slope thus changes the amplitude of the output pulse and number of bits per second that can be transmitted.

Referring again to FIG. 2, the converter 202 can track process characteristics across the isolation barrier 204 by modifying the amplitude of the fast differential edge modulation as a function of speed of an active device 206 on the transmitting side 208 of the isolation barrier 204.

The illustrative signal interface 200 further comprises a digital input source 214 that supplies a digital signal to the converter 202. A pulse slicer 216 can be coupled to the differentiator 210 and configured for slicing a pulse from the differentiator 210 so that a reduced duration pulse is formed with signals below a threshold level rejected. The rejected sub-threshold signals include common-mode noise between the isolated ground planes. A positive feedback recovery element 218 receives the shortened pulse from the pulse slicer 216 and recovers an output digital signal from the reduced duration pulse, thus generating a positive feedback signal.

The converter 202 can be configured for converting the digital signal to the fast differential edge modulation in a transition that contains all information in the digital signal as a slope.

Figure 5:
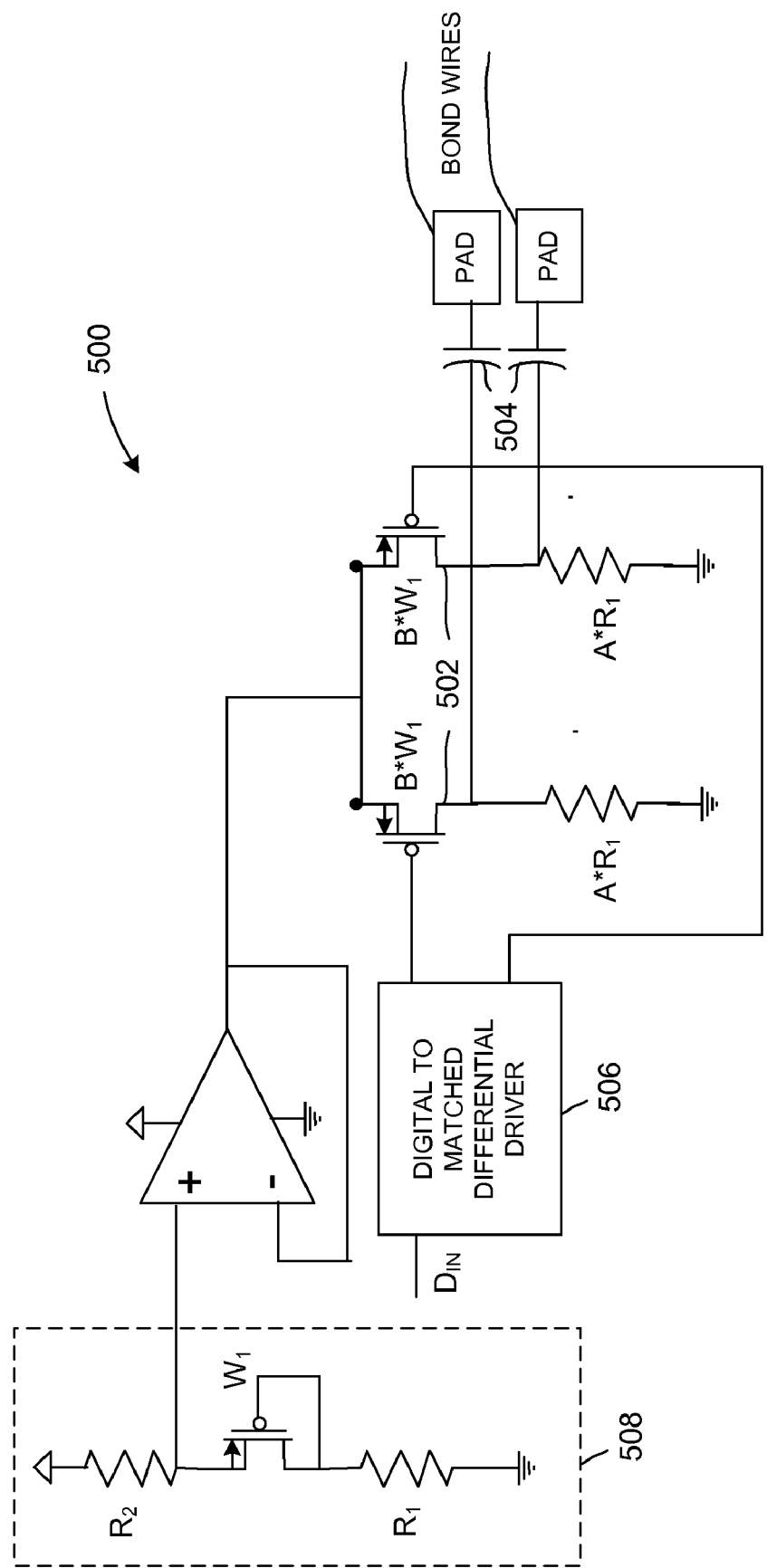
FIG. 5 is a schematic block and circuit diagram depicting an embodiment of a converter that can be used in the interface.

Referring to FIG. 5, a schematic block and circuit diagram depicts an embodiment of a converter 500 that can be used in the interface. The illustrative converter 500 comprises a pair of differential transistors 502 coupled to load resistors $AR_1$ and configured to transmit differential signals to the isolation barrier 504. A digital to matched differential driver 506 can be coupled to control the differential transistor pair 502. A process tracking circuit 508 coupled to the differential transistor pair 502 controls amplitude of voltage as a function of transistor speed.

The converter 500 can be operative to convert the digital signal to the fast differential edge modulation in a transition that contains all information in the digital signal as a slope.

The converter 500 is depicted in a simplified representation as a transmitter with differential p-channel metal oxide semiconductor (PMOS) transistor devices 502 and functional elements to facilitate process tracking of circuits integrated on one or more dies. In some embodiments the transmitter 500 can be integrated on a different integrated circuit die than a corresponding receiver. In other embodiments, a bidirectional implementation can have the transmitter and receiver on the same die.

The illustrative converter 500 has the PMOS devices 502 coupled to ground through load resistors $A*R_1$ and power supplied to the PMOS devices 502 that are regulated by the process tracking circuit 508. In an illustrative example, the process tracking circuit 508 changes voltage amplitude depending on speed of PMOS device 510. Resistors $R_1$ in the process tracking circuit 508 are matched to resistors $A*R_1$. Through selection of components, the edge rate of the signal is made less dependent on process and enables improved tracking on the receiver wafer. Accordingly, conversion to fast differential edge modulation involves modulation of signal amplitude dependent on the process in a manner that differs from operation of a digital interface. The converter 500 thus operates as a digital to analog differential driver.

Referring to FIGS. 6A and 6B, a schematic circuit and block diagram and a symbolic representation depict an embodiment of a differentiator 210, 600 that can be used in the signal interface 200. The converter 202 can be configured for modifying amplitude of the fast differential edge modulation as a function of speed of an active device 206 on a transmitting side 208 of the isolation barrier 204 and the differentiator 210, 600 configured for differentiating the passed fast differential edge modulation. The differentiator 210, 600 comprises an amplifier 602 on a receiving side 212 of the isolation barrier 204 that tracks the active device 206 on the isolation barrier 204 transmitting side 208 whereby differentiation bandwidth tracks slope rate of the differential edge modulation.

The high-level block diagram of the high-speed differentiator 600 shown in FIG. 6A has a current input terminal and voltage output terminal. Amplifiers $AG_{M1}$ and $AG_{M2}$ 602 form a fully differential implementation with common-mode feedback 606 and a GM stage 604. The GM stage 604 includes an amplifier $G_{M1}$ that tracks drivers in the transmitter across the isolation barrier, for example PMOS drivers 502 shown in FIG. 5, which can be integrated from the same wafer as the differentiator 600 so that the bandwidth of differentiator 600 tracks the slope rate of the converter or differential pulse generator, enabling improved amplitude control. Gain bandwidth, amplitude, and slope can be set by calibration of capacitors in the differentiator 600. Capacitors can be metal-metal, metal-insulator-metal (MIM), thin metal oxide semiconductor (MOS), or any suitable capacitor type.

The illustrative differentiator 600 also includes a feedback loop 608 that controls the DC common-mode and differential of the output of the differentiator amplifiers 604. The differentiator 600 for usage in a high-speed isolator interface includes amplifiers $G_{M1}$ and $G_{M2}$ that are fast circuits. Such fast circuits generally have large offsets, and mismatches. The differentiator 600 thus includes a slow loading stage 608 that ensures that differential offset and common mode offset are suppressed. Gain is set by various techniques. For example, gain can be set by the ratio of the differentiator bandwidth and the output GM stage $G_{M2}$ times resistance R1. In an implantation that omits the resistor R1, common mode can be compensated by placing a feedback capacitor on amplifier $G_{M4}$, resulting in a slightly different gain. Various other techniques can be implemented to stabilize the differentiator 600 depending on circuit speed, enabling control of gain amplitude. Additional input signals can otherwise be applied to control the differentiator amplifier stage and perform calibration to attain accurate amplitude from the differentiator or other type of pulse generator.

For an implementation of an interface 200 with a capacitive isolation barrier 204, the converter 202 and differentiator 210 can be configured for tracking the differentiation bandwidth and slope rate of the differential edge modulation whereby capacitor size in the isolation barrier 204 is reduced or minimized, low frequency components in the passed fast differential edge modulation are attenuated, and common mode noise is reduced.

Referring to FIG. 3A in combination with FIG. 2, in some embodiments the interface 200 can be implemented with a capacitive isolation barrier 204 coupled between the converter 202 and the differentiator 210 that comprises multiple inter-level metal dielectric (IMD) capacitors 302.

A feedback control loop 304 can be configured to match a metal-insulator-metal (MIM) capacitor 306 to the IMD capacitors 302 so that differential bandwidth tracks over process variations. A recovery device 206 coupled to the differentiator 210 can be configured for matching a metal-insulator-metal (MIM) capacitor 306 to the inter-level dielectric (IMD) capacitors 302 so that differential bandwidth tracks over process variations by feedback control.

The capacitive isolation barrier 204 can comprise a plurality of inter-level metal dielectric (IMD) capacitors 302 formed on first and second sides of the isolation barrier from respective separate first and second integrated circuit dies from adjacent portions of a common wafer.

The inter-layer metal dielectric (IMD) capacitors 302 are cross-coupling and matched, and are part of the isolation barrier 104. An additional isolation capacitor is included on the die but is not used a part of the isolation barrier. The IMD capacitors 302 and the additional isolation capacitor are on the same die and thus matched. The additional isolation capacitor is coupled to multiple metal-insulator-metal (MIM) capacitors 306 which can be configured similar to a successive approximation converter for functionality as a capacitor balancing circuit 308. The set of MIM capacitors 306 can be formed between two metal layers with a thinner well-controlled oxide that is typical 1-2 fF/um$^2$.

Inherently, the interlayer dielectric is not well-controlled so that gain of the differentiator would vary if capacitors were not matched. The circuit can include a dummy capacitor on each die that match, relying upon a capability to track the process of the two die wafers. One technique for ensuring process tracking is to cut the two dies from adjacent positions on a single wafer, ensuring that the capacitors track to a good degree. Thus, although a capacitor may be measured only on the receiver side, the transmitter interlayer dielectric capacitor does match the receiver side capacitor.

The MIM capacitors 304 are formed between two thin layers of oxide and are matched. A tracking circuit 310 can be used to perform a tracking procedure, for example a binary search or a linear search using a successive approximation converter to set capacitor amplitude, thus functioning as part of the amplifier. In some embodiments, one or more data paths and/or one or more clock signal paths can cross the isolation barrier that is integrated on the same integrated circuit die.

Other techniques can be used to control the gain of the differentiator, such as a self-calibrating loop that adjusts receiver gain during a test pattern such that the amplitude of a peak detector matches a threshold level set by a slower highly accurate comparator.

The operating technique for the illustrative interface 200 can further comprise passing data and clock signal paths across the isolation barrier 204 via the fast differential edge modulation and integrating the data and clock signal paths on a same integrated circuit die.

Figure 7:
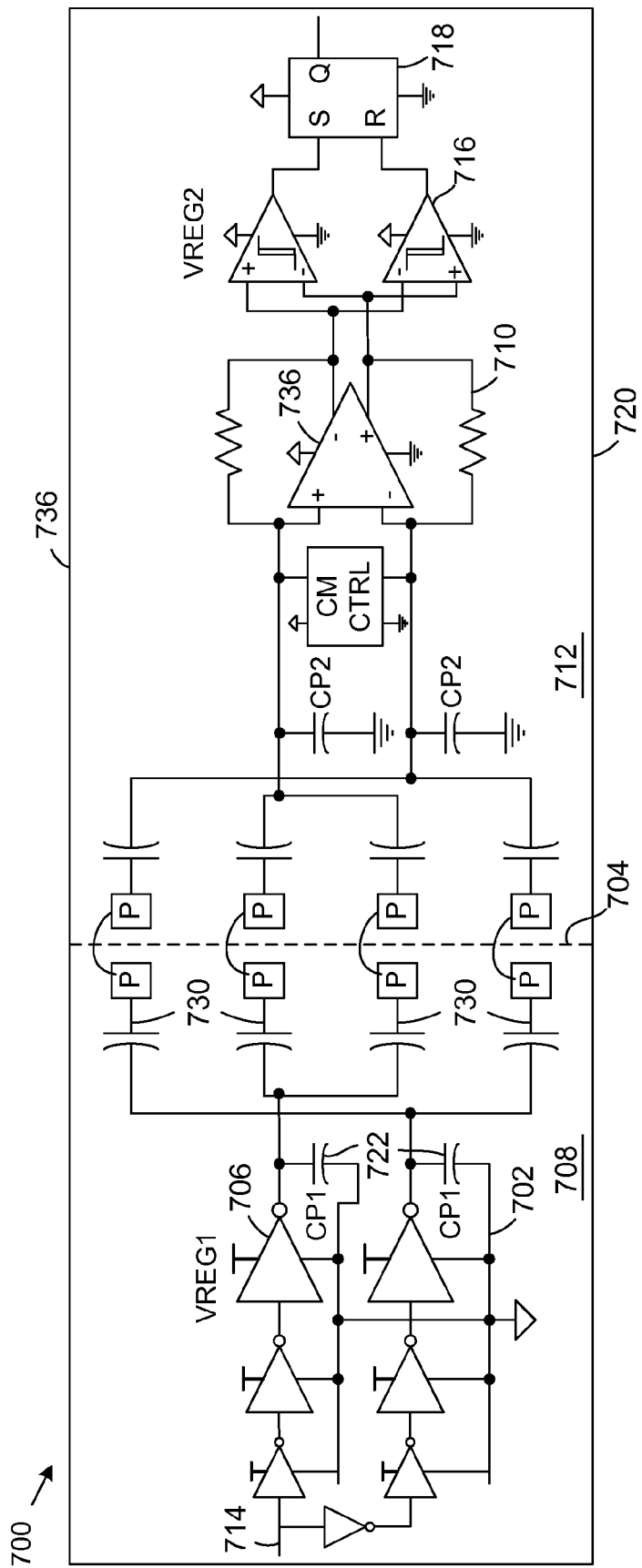
FIG. 7 is a schematic block and circuit diagram illustrating an embodiment of a signal interface.

Referring to FIG. 7, a schematic block and circuit diagram illustrates an embodiment of a signal interface 700 comprising an integrated circuit substrate 720 and an isolation barrier 704 formed by at least two interlayer metal dielectric capacitors 722 that isolate a first domain 708 from a second domain 712 in the substrate 720. A converter 702 in the first domain 708 is coupled to the isolation barrier 704 and configured to convert a digital signal to a fast differential edge modulation that tracks process characteristics across the isolation barrier 704 and pass the fast differential edge modulation across the isolation barrier 704. A differentiator 710 in the second domain 712 is coupled to the isolation barrier 704 and configured to differentiate the passed fast differential edge modulation to form a pulse according to a transfer function that amplifies the pulse.

The signal interface 700 can further comprise a digital input source 714 configured to supply a digital signal to the converter 702. A pulse slicer 716 coupled to the differentiator 710 is configured for slicing the pulse from the differentiator 710 whereby a reduced duration pulse is formed. A positive feedback recovery element 718 coupled to the pulse slicer 716 recovers the output information signal using positive feedback.

One or more signal paths 730 including data paths and/or clock signal paths across the isolation barrier 704 can be integrated on a same integrated circuit die 734.

In some embodiments, the interface 700 can comprise a low voltage differential signaling (LVDS) at an input/output (I/O) terminal of the integrated circuit. The differentiator can be used to pass the LVDS signals across an isolation barrier. The converter 702 performs conversion of the digital input signal to fast differential edge modulation, controlling edge rate and creating a differential signal that is passed across the isolation barrier 704. The signal is passed through the isolation barrier, differentiated by the differentiator 710, typically with either first or second order differentiation, and passed to the feedback recovery circuit 718. The output signal from the differentiator 710 is a pulse.

High-speed communication over the isolation barrier 704 can be facilitated by ensuring that blocks of the first 708 and second 712 domains track, which can be attained by ensuring process tracking of the wafers or dies upon which circuits are integrated. Other calibration techniques can be used to achieve the same result.

Process characteristics are tracked across the isolation barrier 704 by modifying the amplitude of the fast differential edge modulation as a function of speed of an active device 706 on the transmitting side 708 of the isolation barrier 704. The fast differential edge modulation which is passed through the isolation barrier 704 can be differentiated using an amplifier 736 on the receiving side 708 of the isolation barrier 704 that tracks the active device 706 on the isolation barrier transmitting side 712 so that differentiation bandwidth tracks slope rate of the differential edge modulation.

The fast differential edge modulation can be passed through a capacitive isolation barrier 704 and the differentiation bandwidth and slope rate of the differential edge modulation can be tracked so that capacitor size in the isolation barrier is reduced or minimized, low frequency components in the passed fast differential edge modulation are attenuated, and common mode noise is reduced. By varying the slope, the output amplitude can be modulated so that two bits can be transmitted across the barrier using two-bit pulse-amplitude modulation (PAM-4) signaling. Modulation can be adjusted to many more levels and with more complexity additional I and Q channels can be created further expanding channel capacity.

Figure 8A:
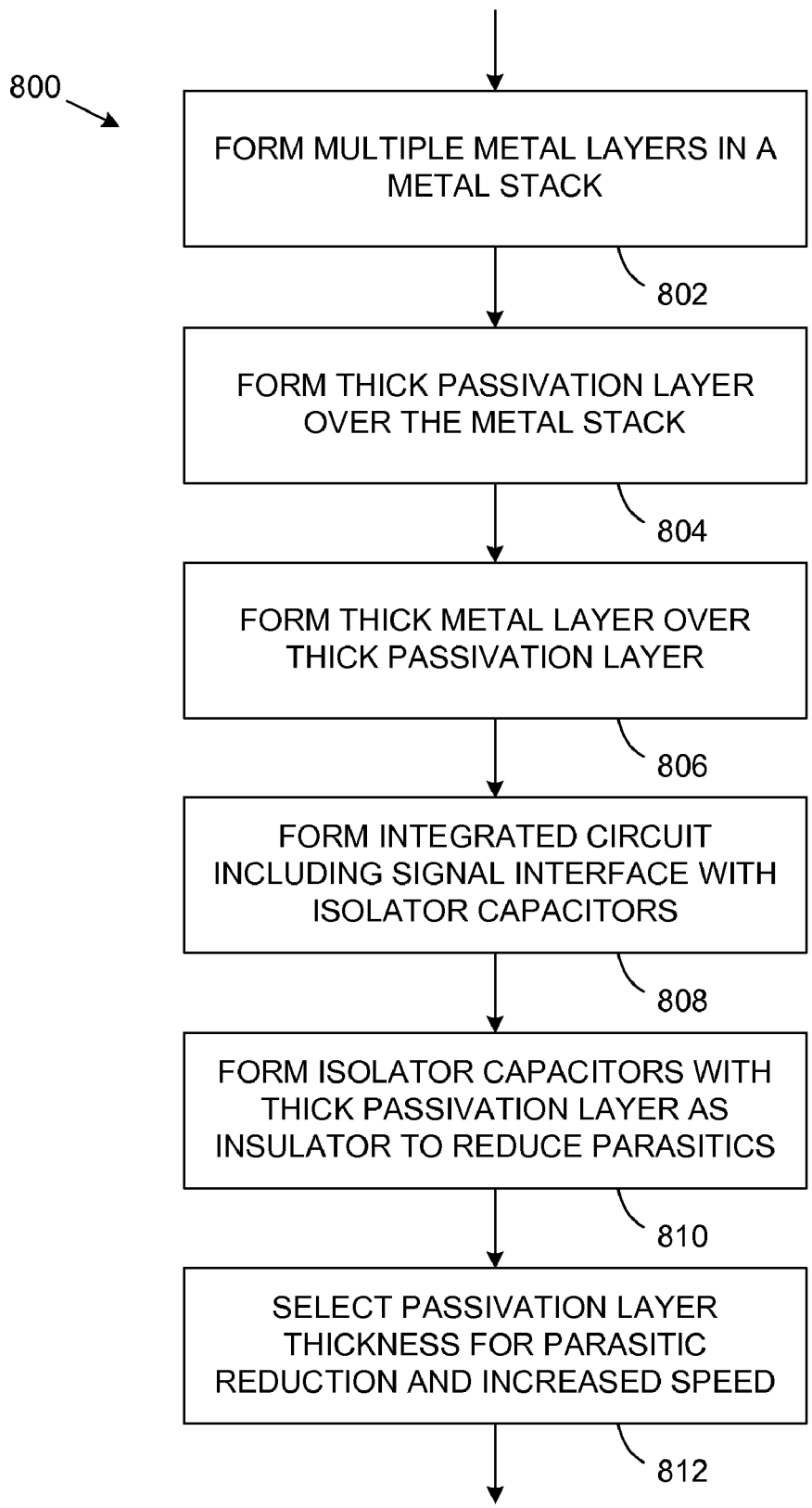
FIGS. 8A through 8E are multiple flow charts showing one or more embodiments or aspects of a method for constructing a semiconductor device.

Referring to FIGS. 8A through 8E, multiple flow charts illustrate one or more embodiments or aspects of a method 800 for constructing a semiconductor device. As shown in FIG. 8A, an illustrative method 800 comprises forming 802 multiple interleaved inter-metal dielectric layers and interlayer dielectrics on a substrate, forming 804 a thick passivation layer on the multiple interleaved inter-metal dielectric layers and interlayer dielectrics, and forming 806 a thick metal layer on the thick passivation layer. An integrated circuit is formed 808 on the substrate which includes a signal interface with one or more isolator capacitors. The isolator capacitors are formed 810 comprising the thick passivation layer as an insulator whereby thickness of the thick passivation layer is selected greater than thickness sufficient for isolation so that testing for defects is eliminated. Thickness of the thick passivation layer also reduces parasitic capacitance.

For example, the multiple interleaved inter-metal dielectric layers and interlayer dielectrics can be formed 802 by distributing the metal layers within silicate glass dielectric layers, separated by thin silicon nitride layers and overlying interlayer dielectric layers. The thick passivation layer can be formed 804 as an undoped silicate glass (USG) layer. The thick metal layer can be formed 806 as a redistribution layer (RDL).

The isolator capacitor or capacitors can be formed 810, for example, with the thick passivation layer used as an insulator whereby thickness of the passivation layer is selected 812 to reduce parasitic capacitance and improve high-speed operation of the interface. In another example implementation, the thickness of the passivation layer can be selected to reduce capacitor size of the one or more isolator capacitors.

In an example arrangement, the substrate, the multiple interleaved inter-metal dielectric layers and interlayer dielectrics layers, the thick passivation layer, and the thick metal layer can be formed by standard processing techniques. However, performance can be improved by forming the thick passivation layer with thickness selected to be larger than for standard processing so that oxide defects are reduced.

In some embodiments, an isolator capacitor can be formed 810 with the thick metal layer functional as a first plate and a predetermined metal layer in the interleaved inter-metal dielectric layer and interlayer dielectric plurality functional as a second plate. The first and second plates are separated by the thick passivation layer. The first plate and the second plate can be arranged as substantially parallel planes extending laterally with an overlap selected to compensate for dielectric leakage and fringe fields from creating voltage gradients.

The first and second plates can be formed with rounded or oblique angles so that electric fields and/or voltage gradients are reduced or minimized.

Figure 8B:
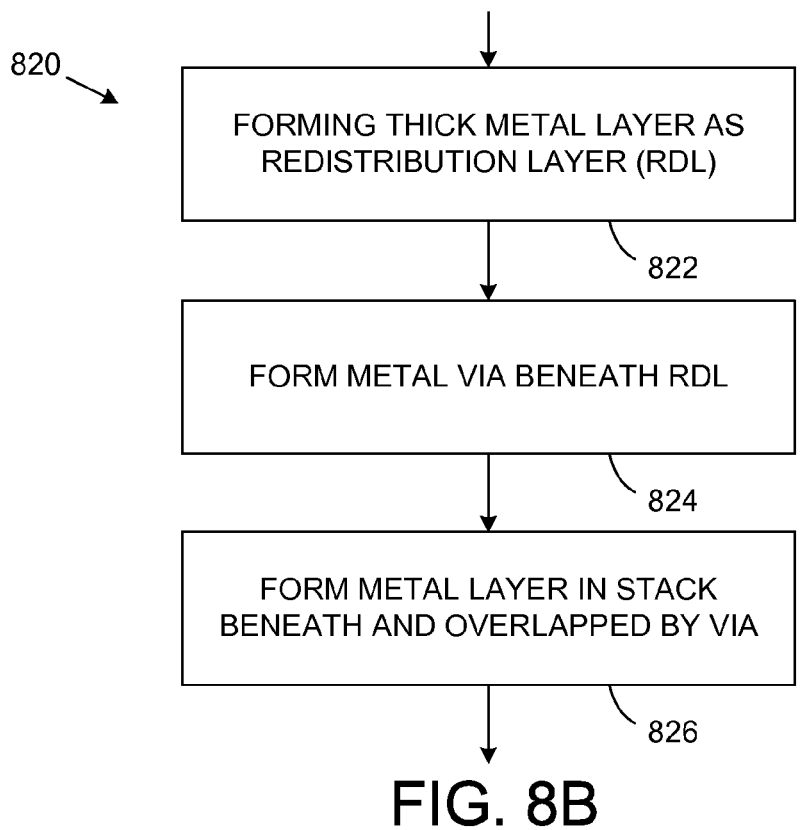

Referring to FIG. 8B, an embodiment of a method 820 for constructing a semiconductor device can comprise forming 822 the thick metal layer as a redistribution layer (RDL) and forming 824 a metal via beneath the RDL. One or more metal layers in the interleaved inter-metal dielectric layers and interlayer dielectrics can be formed 826 underlying the metal via and extending laterally so that lateral extension of the metal via overlaps the predetermined metal layer.

One or more metal layers can be formed in selected layer or layers of the interleaved inter-metal dielectric layers and interlayer dielectrics in positions underlying a metal via and extending laterally so that lateral extension of the metal via overlaps the predetermined metal layer.

In some embodiments, at least one metal via can be formed to prevent deposition of materials with unfavorable breakdown voltages.

Figure 8C:
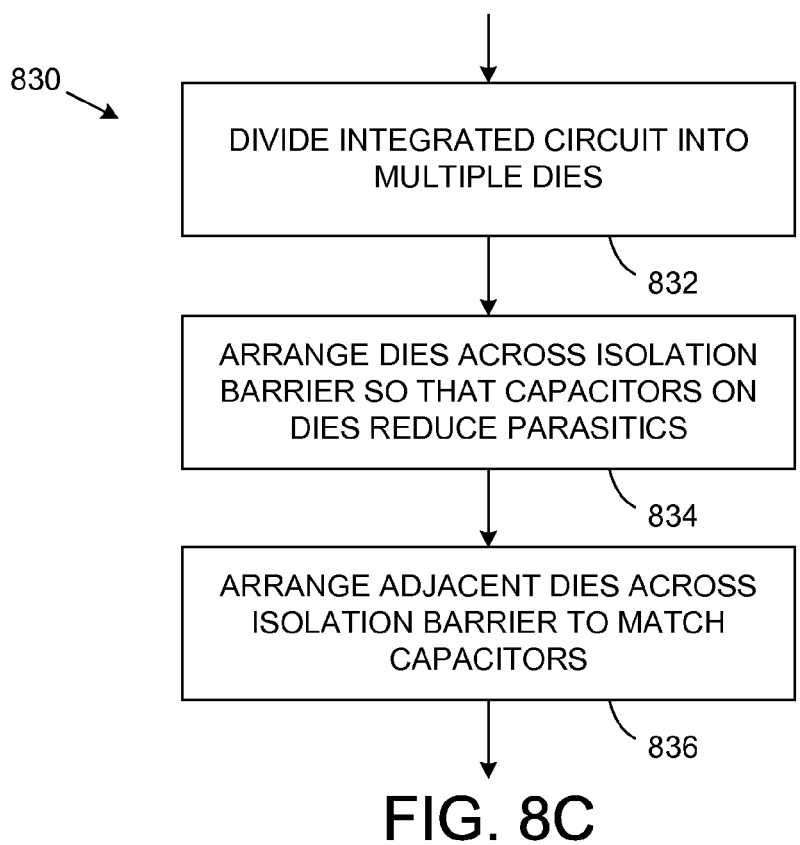

Referring to FIG. 8C, an embodiment of a method 830 for fabricating a semiconductor device can comprise dividing 832 the integrated circuit into at least two dies and arranging 834 the dies across an isolation barrier so that capacitors respectively formed on separate dies are configured with a reduced ratio of parasitic capacitance to primary capacitance. In addition, the adjacent dies from the integrated circuit can be arranged 836 across an isolation barrier so that capacitors are matched.

In some embodiments, parts of capacitors can be formed on different dies, taken from the same wafer. The different dies are combined into a package with the parts of the capacitors arranged to form complete capacitors with matched characteristics.

Figure 8D:
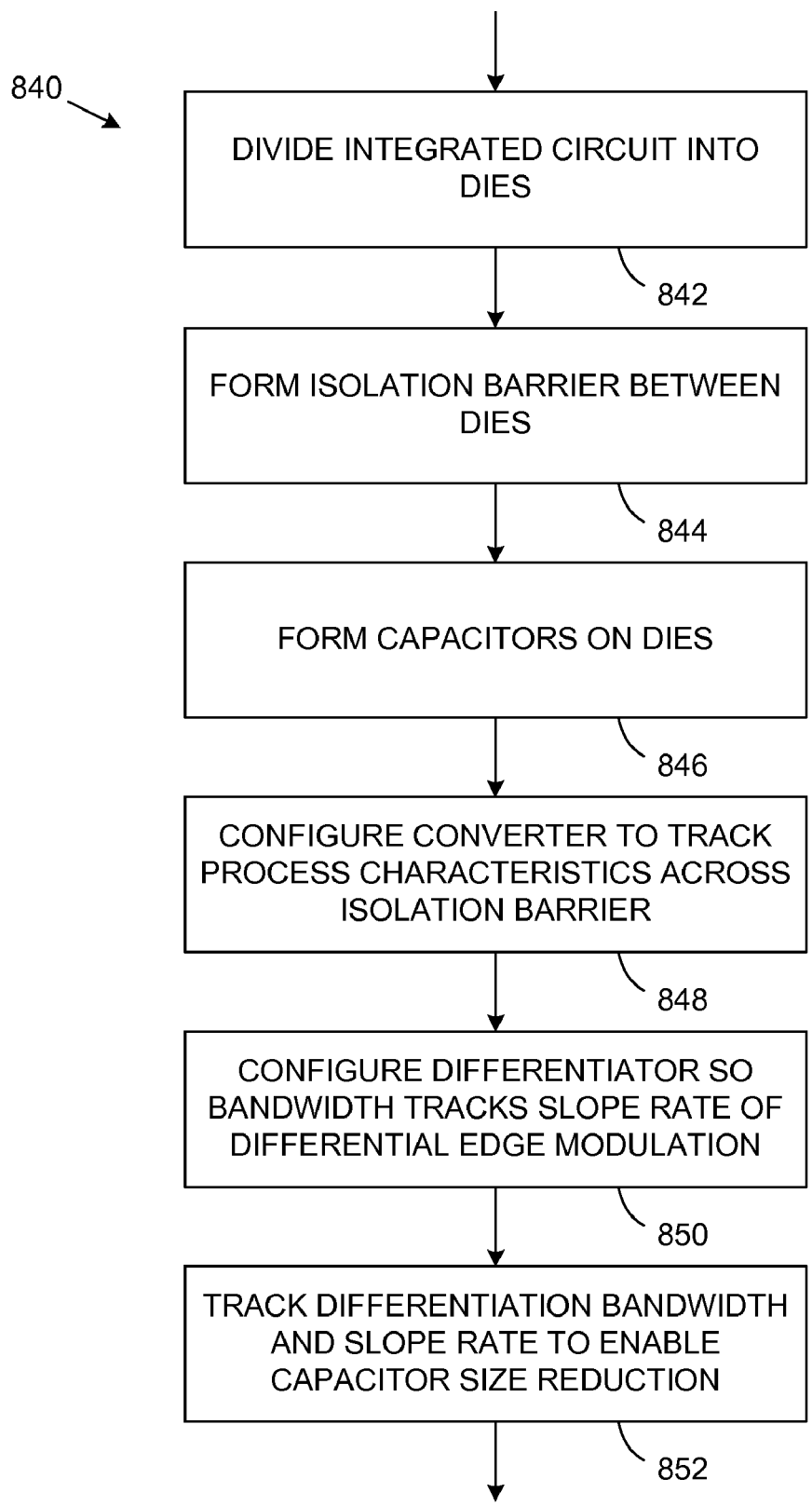

Referring to FIG. 8D, an embodiment of a method 840 for constructing a semiconductor device comprises dividing 842 the integrated circuit into first and second dies, forming 844 an isolation barrier between the first and second dies, and forming 846 multiple capacitors respectively on separate dies. A converter can be configured 848 in the first die to track process characteristics across the isolation barrier and modify amplitude of a fast differential edge modulation as a function of speed of an active device on a transmitting side of the isolation barrier. A differentiator in the second die can be configured 850 to differentiate the fast differential edge modulation on a receiving side of the isolation barrier whereby differentiation bandwidth tracks slope rate of the differential edge modulation.

The differentiator can be configured to include a calibrated capacitor that matches the multiple capacitors on the separate dies.

In some embodiments, the method 840 can further comprise forming 844 a capacitive isolation barrier between the converter and the differentiator for passing the fast differential edge modulation. The converter and differentiator can be configured 852 for tracking the differentiation bandwidth and slope rate of the differential edge modulation so that capacitor size in the isolation barrier is reduced or minimized, low frequency components in the passed fast differential edge modulation are attenuated, and common mode noise is reduced.

Figure 8E:
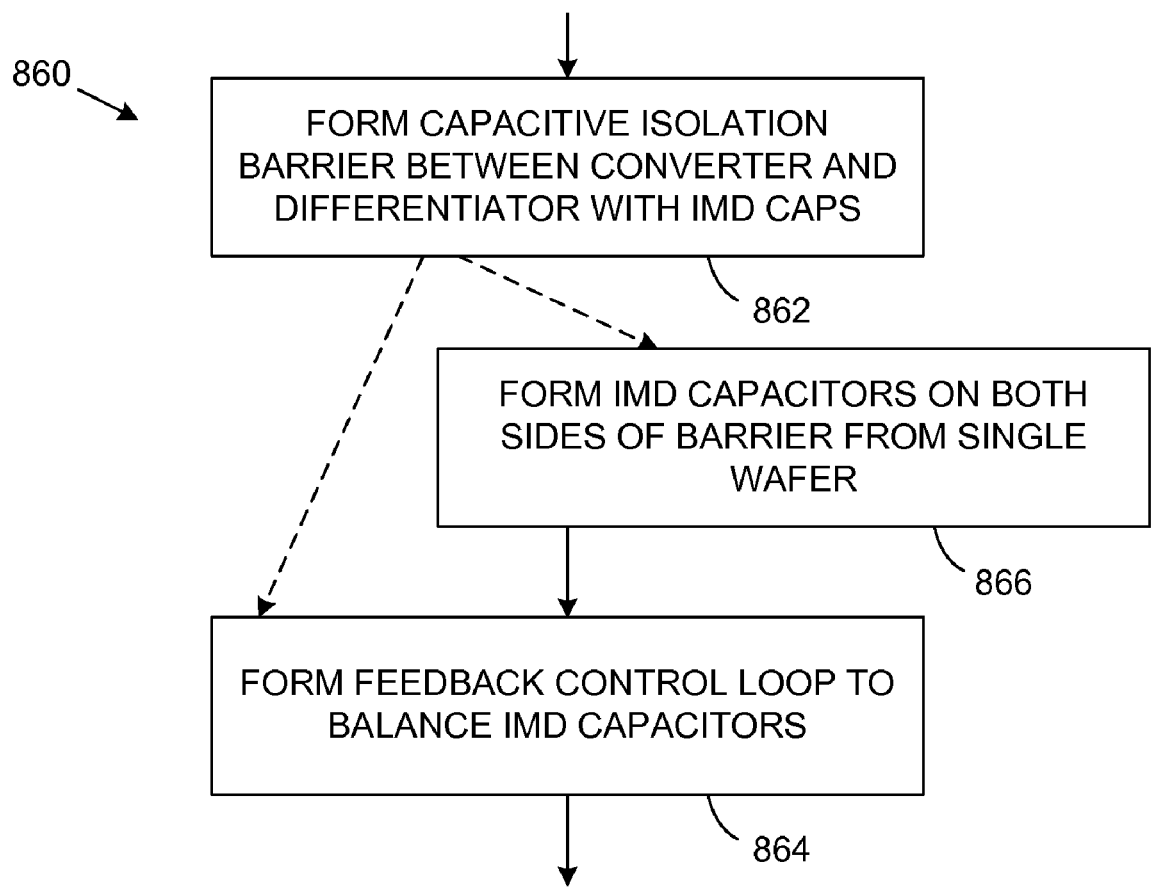

Referring to FIG. 8E, an embodiment of a method 860 for constructing a semiconductor device can further comprise forming 862 a capacitive isolation barrier between the converter and the differentiator comprising a plurality of inter-level metal dielectric capacitors. A feedback control loop can be configured 864 to balance the plurality of inter-level metal dielectric capacitors.

The capacitive isolation barrier can be formed 862 by forming 866 multiple inter-level metal dielectric capacitors on first and second sides of the isolation barrier from respective separate first and second integrated circuit dies from adjacent portions of a common wafer.

FIG. 9 is a schematic circuit diagram showing an embodiment of a signal isolator 900 that implements process tracking enabling high-speed performance for the differentiator 940, thereby facilitating high-speed performance of the isolator interface 900. The differentiator 940 has a current input signal and voltage output signal. The voltage output signal from the differentiator 940 is passed to slicers 942 that have a reference voltage and operate upon the differential output. Slicers 942 operate according to a threshold which is set either through use of a peak detector, through calibration, or other suitable threshold technique. Process tracking enables predetermination of the amplitude of the signal passed from the slicers 942 to the recovery element 926. In some embodiments, the threshold can be set using a peak detector for adjusting the slicers 942, at the expense of detriment to margin operation. In other embodiments, the threshold can be set without harm to margin operation, by implementing the transmitter 910 as is illustrated and described with respect to FIG. 4 and by implementing the differentiator 940 as is illustrated and described with respect to FIGS. 5A and 5B.

The signal isolator 900 functions essentially as a digital-to-analog converter followed by an analog-to-digital converter (D/A→A/D) due to operation of the slicer 942, which functions almost like a digital communication channel but communicates information using analog techniques that are reliant on process matching.

In the illustrative example, capacitors 906 and associated bond wires are placed in a physical configuration whereby the differential current flow in the loops 912 are in balance to the first order and generate magnetic fields that cancel, creating a magnetic dipole with greatly reduced far-fields. The same principle also enables the device to reject magnetic interference so that the circuit attains a magnetically differential characteristic.

In the illustrative example, capacitors 906 and associated bond wires are placed in a physical configuration whereby the differential current flow in the loops 912 is in balance to the first order and generates magnetic fields that cancel, creating a magnetic dipole with greatly reduced far-fields. The same principle also enables the device to reject magnetic interference so that the circuit attains a magnetically differential characteristic.

In various embodiments, the isolation barrier 904 can be configured in any suitable arrangement such as two or more interlayer metal dielectric capacitors 916A formed in the first domain 908A and two or more interlayer metal dielectric capacitors 916B formed in the second domain 908B. In another arrangement, the two or more interlayer metal dielectric capacitors 906 can be formed partly in the first domain 908A and partly in the second domain 908B. Also, the two or more interlayer metal dielectric capacitors 906 can be formed between the first 908A and second 908B domains. Furthermore, the interlayer metal dielectric capacitors 906 can be formed partly in the first domain 908A, partly in the second domain 908B, and partly between the first and second domains. The differentiator 940 separates a common-mode to differential component from true differential components. Common mode suppression element 932 can be used to maintain the differentiator 940 is linear range.

The differentiator 940 is shown with resistive feedback and connected to the common mode control element 932. In some embodiments, the common mode control element 932 can be omitted through usage of common mode techniques in configuring the differentiator. As long as common mode feedback is maintained, low impedance input is inherent, enabling elimination of the common mode control element 932. Other designs can include multiple differentiators coupled in series to form a low impedance input condition to the receiving side of the isolation barrier. Accordingly, several techniques can be used to implement a differentiator that forms a low impedance input condition which is desirable for usage with capacitors, as opposed to inductors.

The differentiator 940 is shown with resistive feedback and connected to the common mode control element 932. In some embodiments, the common mode control element 932 can be omitted through usage of common mode techniques in configuring the differentiator. As long as common mode feedback is maintained, low impedance input is inherent, enabling elimination of the common mode control element 932. Other designs can include multiple differentiators coupled in series to form a low impedance input condition to the receiving side of the isolation barrier. Accordingly, several techniques can be used to implement a differentiator that forms a low impedance input condition which is desirable for usage with capacitors, as opposed to inductors.

In some embodiments, the differentiator 940 can be configured as a current mode differentiator. In various implementations, modulation can be implemented in a variety of different ways, including but not limited to pulse width modulation (PWM), delta modulation (DM), frequency modulation (FM), phase modulation, and others.

Figure 10A:
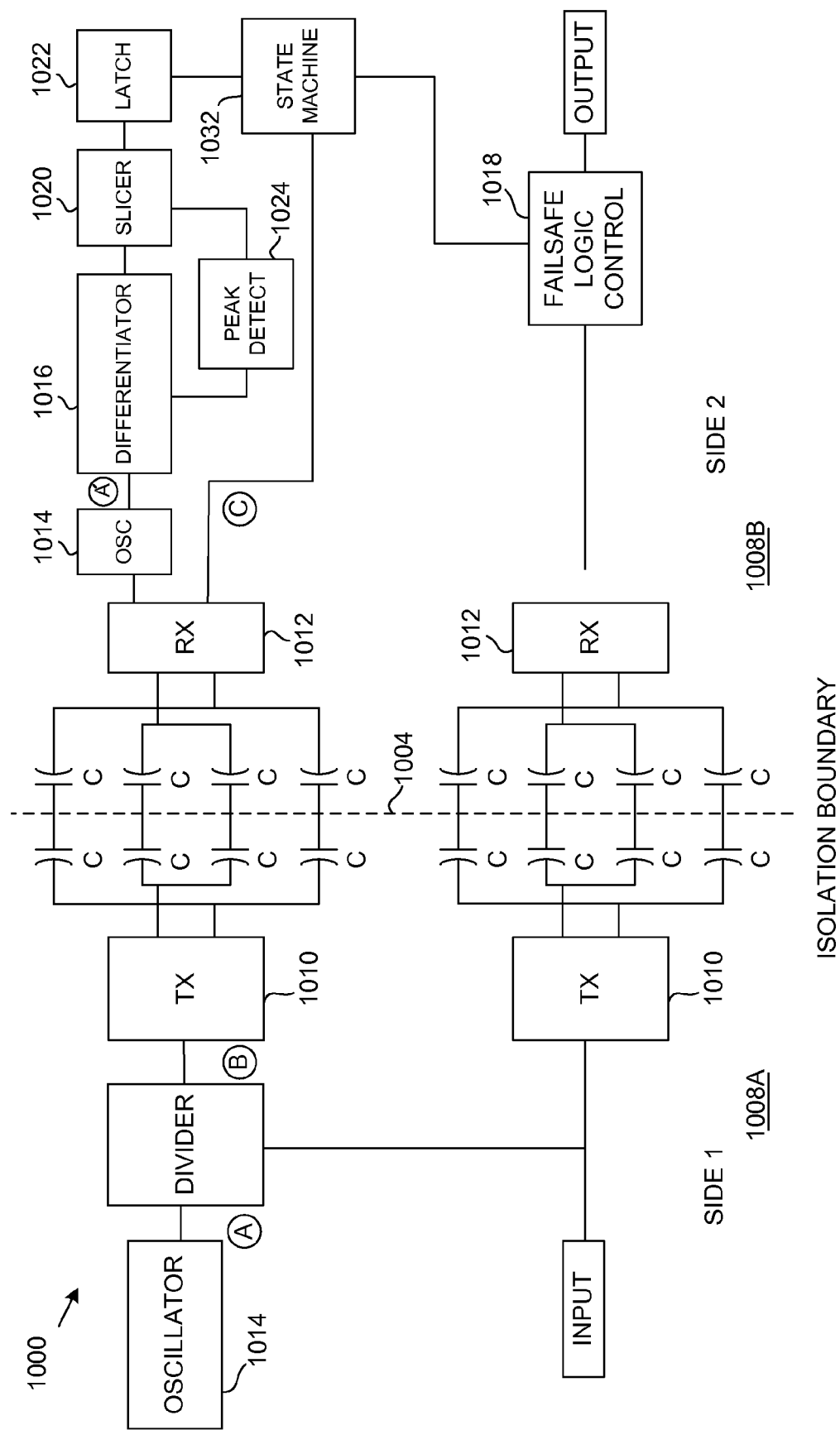
FIGS. 10A and 10B are schematic block and circuit diagrams illustrating an embodiment of an isolator interface that implements a management channel configured to operate continuously to set amplitude.
Figure 10B:
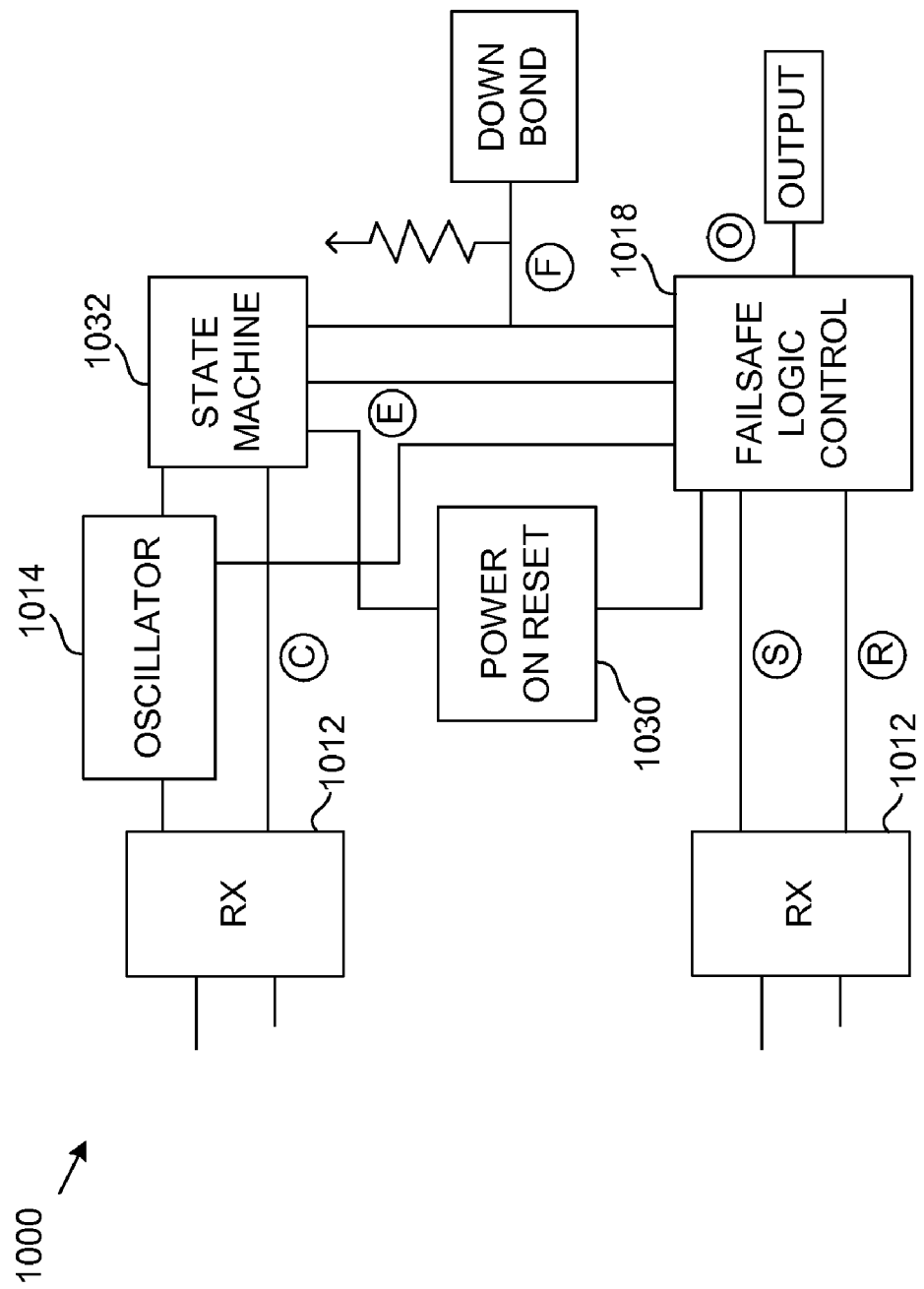

In some implementations, the illustrative slicer can be used to set a threshold base either through process tracking or by usage of a peak detector that monitors signal amplitude. A peak detector can be omitted by using a management channel to set signal amplitude. Referring to FIGS. 10A and 10B, schematic block and circuit diagrams illustrate an embodiment of an isolator interface 1000 that implements a management channel that can operate continuously to set amplitude.

The signal isolator 1000 including a management channel has an oscillator 1014 driving a transmitter 1010. A receiver 1012 receives signals from the transmitter 1010 from across the isolation barrier 1004, and passes the signals to a differentiator 1016 then to a slicer 1020 and latch 1022. The differentiator 1016 can operate continuously and feed a differentiated signal to a peak detector 1024 that determines peak amplitude that can be used to set the threshold of the slicer 1020 in the main channel, and determine the voltage and divide the voltage down by two. The management channel approach can be used in some implementations as an alternative to setting amplitude to a particular reference by setting amplitude using a peak detector and relying on process tracking to ensure that the amplitude has sufficient margin.

In contrast to the isolator 1000, the implementation of the signal isolator 100 shown in FIG. 1 can avoid the cost and complexity of a second isolator channel and logic to set slicer threshold by using the differentiator 110 on the receiving side 112 of the isolation barrier 104 to track the active device 106 on the transmitter 102 so that differentiation bandwidth tracks slope rate of the differential edge modulation, thereby enabling reduction in the size of the capacitor or capacitors in the isolation barrier 104 and facilitating attenuation of low frequency. The signal isolator 100 exploits the spectral separation of common mode noise that results from the differential passage of the signal across the isolation barrier 104 so that gain is added to the circuit while reducing the size of the capacitors.

The depicted signal isolator 1000 comprises an isolation barrier 1004 that isolates first 1008A and second 1008B domains and one or more fully differential transmitters 1010 in the first domain 1008A which are configured to transmit a digital signal containing all information in an information signal in an edge of a single transition across the isolation barrier 1004 to the second domain 1008B. The signal isolator 1000 further comprises one or more fully differential receiver 1012 in the second domain 1008B which are configured to receive and differentiate the transmitted digital signal.

In a particular embodiment, the signal isolator 1000 can comprise an isolation barrier 1004, and first 1008A and second 1008B separate dies from a common wafer. The signal isolator 1000 can comprise a transmitter 1010 on the first die 1008A and a receiver 1012 on the second die 1008B in a configuration that communicates an information signal across the isolation barrier 1004 as a digital signal that contains all information in a single transition edge. The signal isolator 1000 can further comprise oscillators 1014 on the first 1008A and second 1008B dies that are to be matched to a reasonable tolerance due to close location of the dies on the integrated circuit wafer.

The illustrative signal isolator 1000 implements a management channel concept and includes a structure with two or more channels, each of which has a transmitter 1010 and receiver 1012 positioned across the isolation boundary 1004 with the multiple channels positioned side-by-side to enable comparison of timing or frequency signals. The two or more channels are positioned side-by-side to maintain state if the state is corrupted for some reason or condition. The multiple channels enable state to be maintained when clock signals are corrupted. Maintenance of the channels is useful in the illustrative edge-based system because corruption that results in termination of edge transitions could possibly enter state that cannot be restored. Corruption can occur during operation of the system or during power-up. The illustrative signal isolator 1000 can include a power-on reset (POR) element 1030 that functions in combination with the state machine 1032 and fail-safe control logic 1018. For example, initially upon system power-up no edge transitions may be generated. Control logic in the signal isolator 1000, including the POR function element 1030 and failsafe logic control 1018, ensures that the correct system state can be determined.

Referring to FIG. 10B, a schematic block diagram illustrates an example embodiment or implementation of management control structures on the second die 1008B. The signal isolator 1000 can further comprise a state machine 1032 coupled to the receiver 1012 on the second die 1008B and a failsafe logic 1018 coupled to the state machine 1032 on the second die. The state machine 1032 and the failsafe logic 1018 can be configured to determine frequency of a signal transmitted across the isolation barrier 1004, compare frequency of a local oscillator signal to the frequency of the transmitted signal, and correct transmitted state based on the comparison.

Referring to FIG. 10C in combination with FIG. 10A, a set of time waveforms depicts digital signals at several locations in the digital isolator 1000 including a signal A generated by the oscillator 1014 on the first die 1008A, a signal B that results from passage of the signal from the oscillator through a divider, and a signal C passed by the receiver 1012 on the second die 1008B that receives a signal transmitted across the isolation barrier 1004. Signal A' is generated by the oscillator 1014 on the second die 608B. The time waveforms illustrate usage of a second isolator channel to ensure fail-safe operation. Dotted lines for signal A depict clock frequency variation, for example ±44%, due to process variability. In an example implementation, the variation in clock frequency from die-to-die can be limited to a suitable amount, for example ±5% by using two dies from the same wafer with additional improvement attained by using dies that are adjacent from the same wafer.

The separate dies can be constructed from the same wafer, or from adjacent locations on the same wafer, so that the constructed package has circuit dies that are mirror images of one another with one die implementing a transmitter and the other die implementing a receiver, and each die implementing an oscillator. The mirror images ensure relative matching of clock signals.

Signals B(1) and B(0), and signals C(1) and C(0) depict signals at common positions in different channels. Signals B(1) and B(0) are transmitted from the output terminal of the divider on first die 1008A based on whether the transmitted data bit is either a one or a zero. Signals C(1) and C(0) depict signals recovered on second die 1008B that can then be compared in the state-machine which use the oscillator 1014 on die 1008B to measure the frequency of the transmitted data. Transmission is much slower than the normal path but can be used to ensure that the receive data is correct should the data be incorrect and enable failsafe startup operation by ensuring that output data remains fixed until both dies 1008A and 1008B are powered and operational.

Figure 10D:
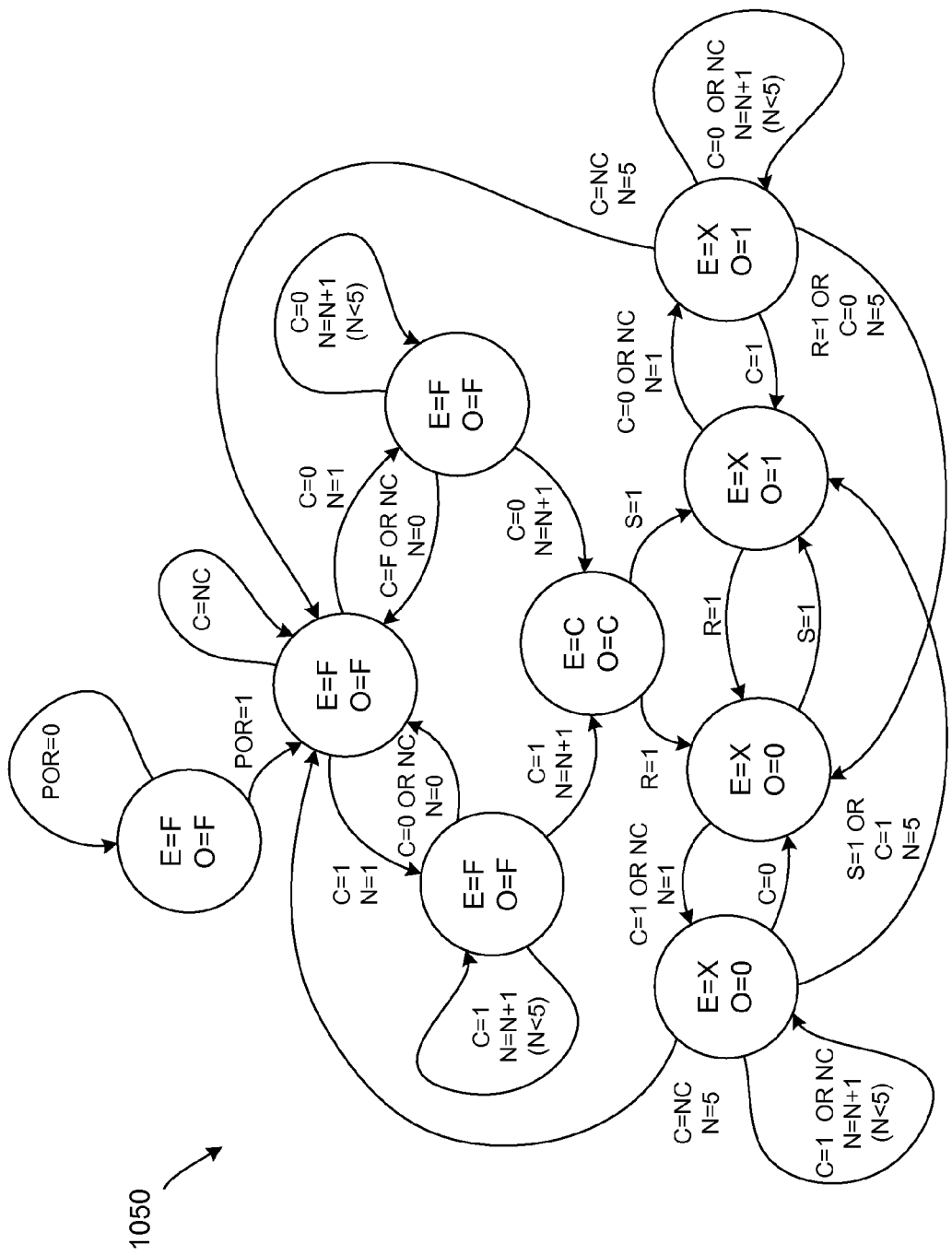
FIG. 10D is a state diagram illustrating an embodiment of operation of the state machine and failsafe logic for managing channels in the signal isolator.
Figure 10E:
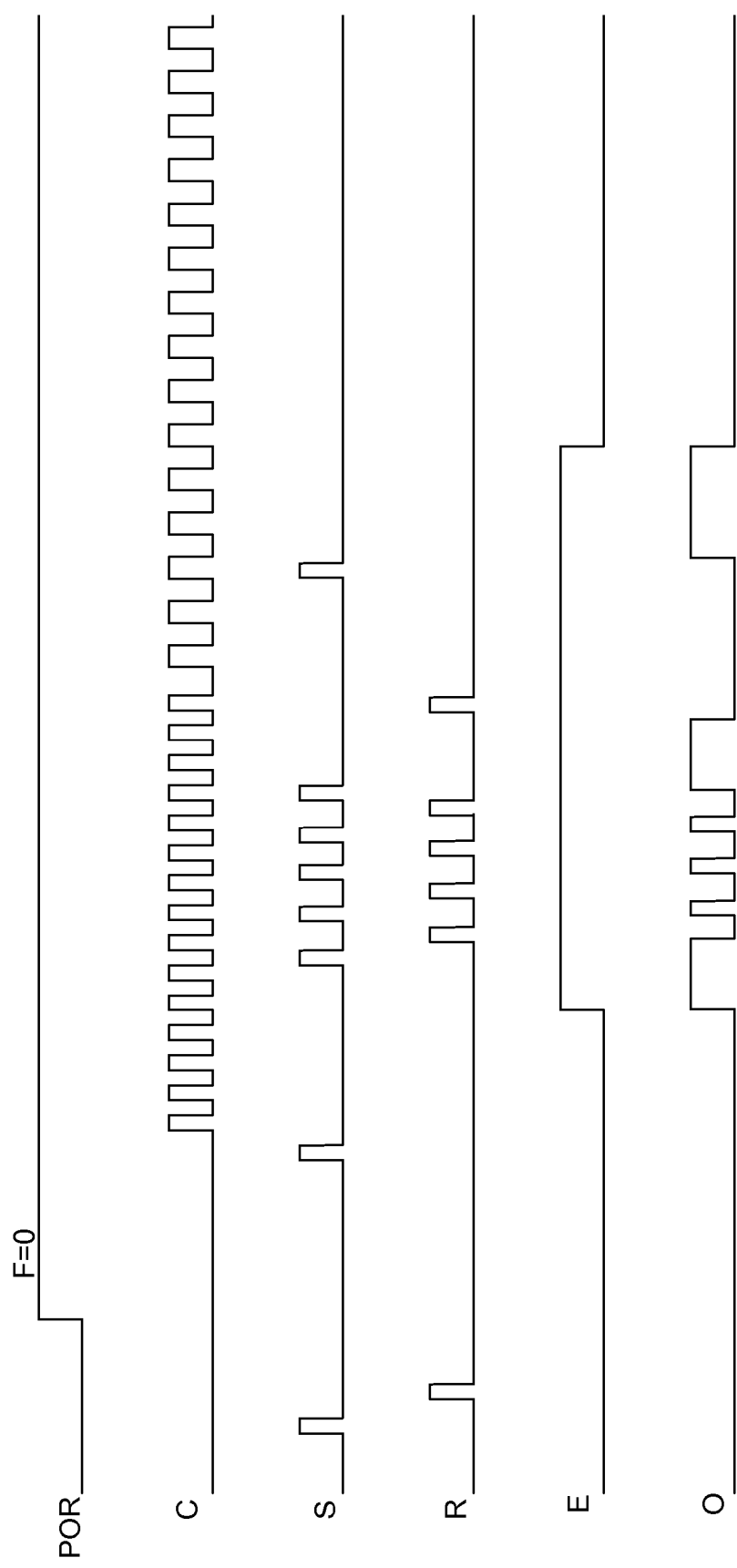
FIG. 10E is a set of time waveforms depicting digital signals at several locations in the digital isolator.

Referring to FIG. 10D in combination with the structures shown in FIGS. 10A and 10B, a state diagram 1050 illustrates an embodiment of operation of the state machine 1032 and failsafe logic 1018 for managing channels in the signal isolator 1000. Also referring to FIG. 10E in combination with FIGS. 10A and 10B, a set of time waveforms depicts digital signals at several locations in the digital isolator 1000 including a power-on-reset (POR) signal, the signal C which is passed by the receiver 1012 on the second die 1008B that receives a signal transmitted across the isolation barrier 1004, and signals S and R that are passed from the receiver 1012 to the failsafe logic 1018. Waveforms further include a signal E that passes as control from the state machine 1032 to the failsafe logic 1018, and an output signal O.

A first data bit is delayed until power-up of side 1 is verified. The control logic ensures that the digital isolator 1000 changes state due to power-up transients. Delay time is variable for a particular implementation although a common range can be 0.32-1.44 μsec.

The illustrative channel management technique has two aspects including usage of two separate dies for the respective transmitter and receiver channels with oscillators on each die, and a control logic to ensure the correct state on power-up. The two side-by-side channels include one channel enabling high-speed operation to the main channel so that no modulation technique is implemented except for the edge transition. The second channel is a maintenance or management channel to ensure that a state that becomes corrupted for any reason which results in no edge transmission will be corrected.

The state diagram 1050 can be configured to initially avoid transition based on any type of noise, for example by controlling a secondary channel, which can be a management channel, to initially ignore changes on the primary channel but only respond to changes in the secondary channel. In operation subsequent to initialization, the secondary channel can respond to changes in the primary channel.

The oscillators are located on both sides of the package, in each of the separate dies, and are presumed to be well-matched to a selected tolerance such as ±5%. Digital frequency measuring can be used to measure the frequency transmit state, as shown in waveform C in FIG. 10E, so that when a logical 1 is transmitted the waveform frequency is higher, and when transmitting a logic 0 the frequency is lower, for example by approximately half. Accordingly, the logic signal is communicated as a shift in frequency.

On the second die, the receiver 1012 receives transmitted information and passes the information to the state machine 1032 that uses the local oscillator 1014 to detect frequency local to the second die. Because the timing components on the two dies are taken from the same wafer and have suitable relative matching, the transmitted timing signals and timing signals generated locally to the second die can be compared, enabling detection of the transmission state for parallel channel management.

The state diagram 1050 shows operation wherein a departure from normal operation detectable as a state on the second die that does not match the transmitted state through the management channel that endures for a selected time, for example a microsecond or several microseconds, activates correction of the state. The corrupted state from any cause, for example an alpha particle or other noise, can be detected and corrected on the second side. The management channel ensures that the state is corrected.

In the illustrative embodiment, the power-on-reset (POR) element 1030, the failsafe logic 1018 and the state machine 1032 operate in combination to control the management channel interaction in normal operation without impacting high-speed operation. If an error condition causes a mismatch in the transmitted and local timing signals on the second side that is maintained for a particular number of time periods, for example five time periods as shown, the control logic will correct the state. The frequency handling in shown in FIG. 10E at line C with the frequency changing from a higher frequency to a lower frequency.

Figure 11:
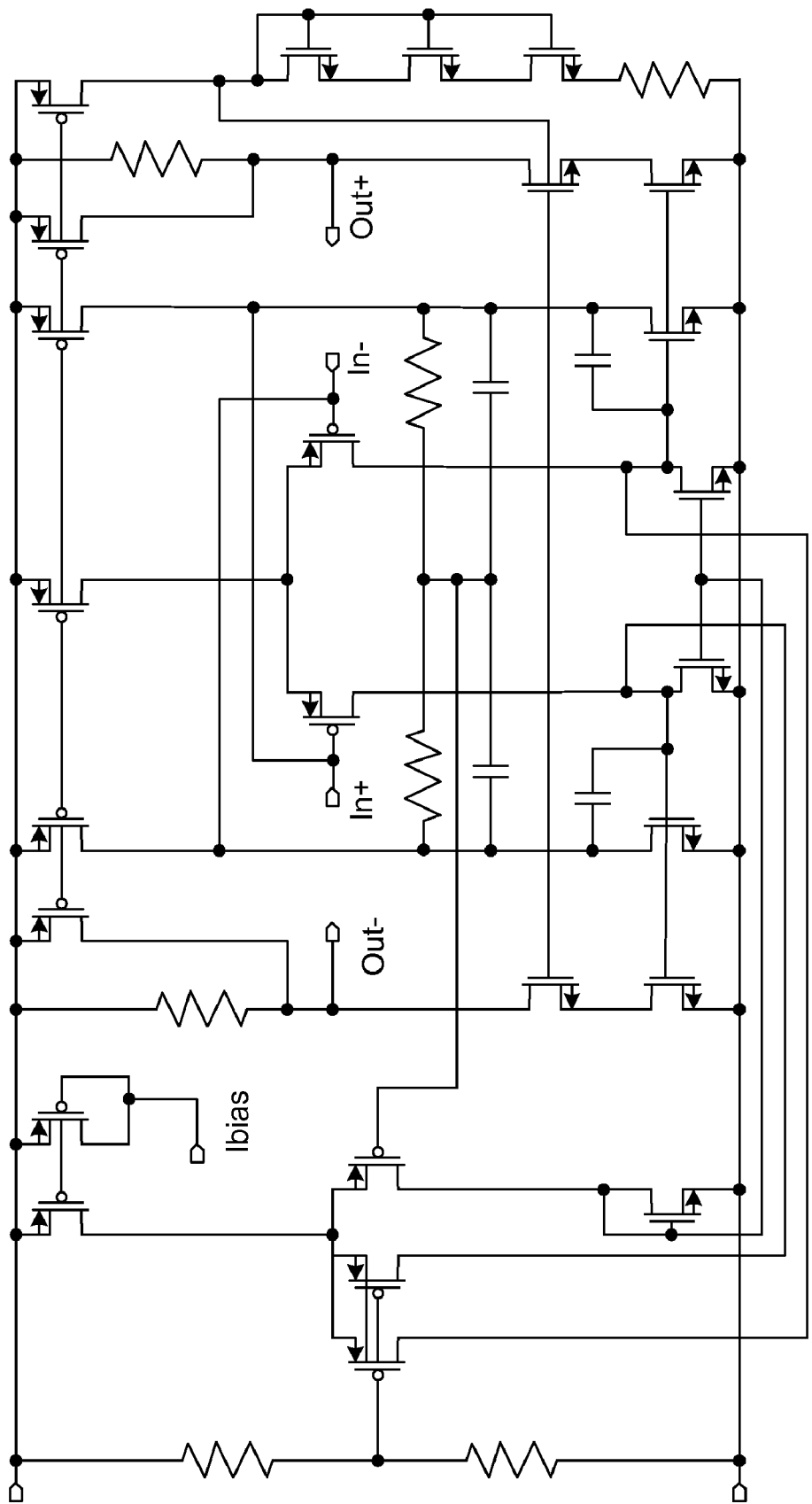
FIG. 11 is a schematic circuit diagram illustrates an embodiment of a high-speed differentiator that can be implemented in a digital signal isolator.

Referring to FIG. 11, a schematic circuit diagram illustrates an embodiment of a high-speed differentiator 1100 that can be implemented in a digital signal isolator.

Figure 12A:
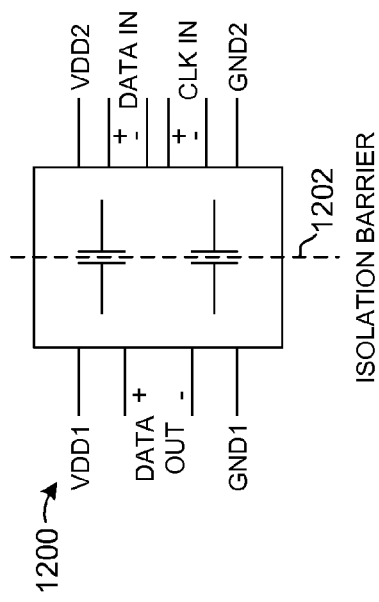
FIGS. 12A and 12B are schematic block and circuit diagrams respectively showing implementations of blocking on an isolated interface in a low voltage differential signaling (LVDS) system and a serial gigabit media independent interface (SGMII) system.

Referring to FIG. 12A, a schematic block and circuit diagram shows an implementation of blocking on an isolated interface 1200 in a low voltage differential signaling (LVDS) system. LVDS is a differential signaling system that transmits two differential voltages for comparison at a receiver, using the difference between the voltages to encode information.

Figure 12B:
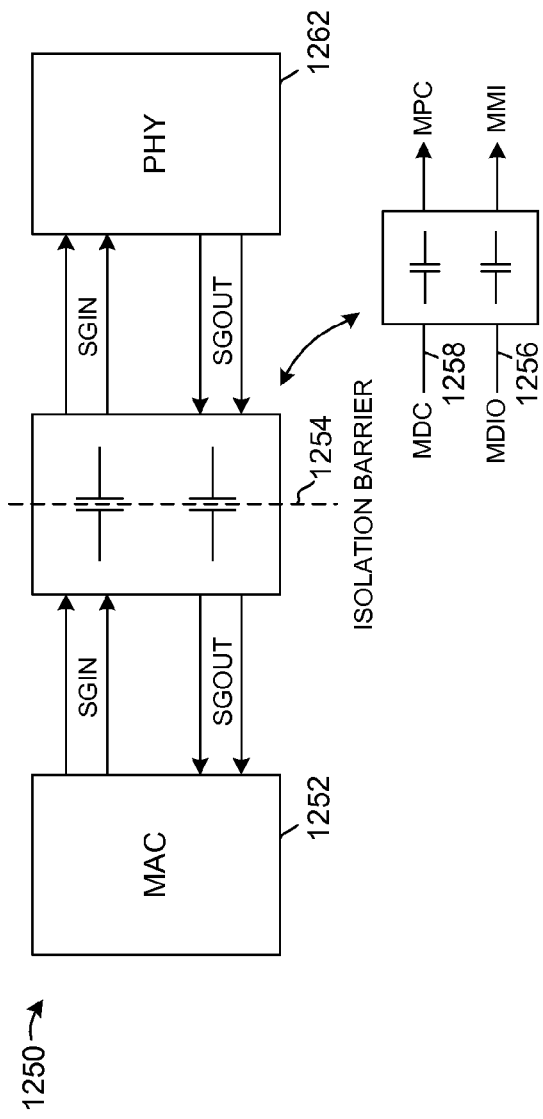

Blocking on the high-speed interface that isolates VDD1 and VDD2 is implemented to meet high-frequency specifications of LVDS, and serial gigabit media independent interface (SGMII) depicted in FIG. 12B. LVDS has a differential drive capability, as indicated with the plus and minus DATA IN lines on the VDD2 side of the isolation barrier 1202. On one side of the LVDS isolated interface 1200 are power VDD1 and ground GND1 and differential DATA OUT lines. On the opposing side of the LVDS interface 1200 are power VDD2, ground GND2, differential DATA IN lines and a clock signal.

FIG. 12B is a schematic block and circuit diagram showing an implementing of blocking on an isolated interface 1250 in a serial gigabit media independent interface (SGMII) system. SGMII 1250 is an interface used to connect an Ethernet media access control (MAC) 1252 to a PHY 1262 in an Ethernet gigabit application. An isolation barrier 1254 at the SGMII 1250 isolates management data input/output (MDIO) 1256 and a management data clock (MDC) pin 1258. MDIO 1256 is an Ethernet protocol bus structure that connects MAC devices with PHY devices and enables a user to change configuration information during operation and to read PHY status information. SGMII 1250 can be implemented to support both data and a clock signals including DATA IN and DATA OUT pins, and a CLOCK OUT pin, in combination with support of sufficiently exact timing to support the high-speed functionality of the interface. In an example implementation, the timing specifications can be satisfied by integrating clock and data paths onto the same die. Some configurations can include two data input pins integrated into the same die in an isolator package to further facilitate timing performance. In the illustrative high-speed interface, skew and jitter specifications can be attained by integrating the clock and data paths on the same die and balancing the pathways. The interface supports clock and data input signals through the isolation barrier 1254 to clock and data output signals, and thus produces data in and data out with isolation of data and clock signals.

The SGMII isolator 1250 includes a transmission stream with data flowing to a receiver with signals $SG_{IN}$ and $SG_{OUT}$ passing through the isolation barrier 1254 which can be capacitive or other isolation. To facilitate performance according to specifications for high-speed operation, both sides of the isolation barrier 1254 can be fabricated on the same die. Communication between the PHY 1262 and the MAC 1252 goes through the SGMII 1250 which forms the isolation barrier 1254 to that PHY 1262.

The SGMII isolator 1250 can be implemented with the MDIO 1256 and MDC 1258 and thus can be formed without differential in and differential out pins. The MDIO 1256 can form a differential interface to the PHY 1262. In other configurations, the SGMII isolator 1250 can be implemented with differential input and differential output lines.

The balancing and matching of signal pathways is most feasible by integration of the isolator 1200, 1250 since usage of an external capacitor creates mismatches and/or is physically too large for suitable implementation.

The illustrative isolator embodiments enable support of LDVS and SGMII signaling through a high-speed isolator at speeds that have heretofore made such isolation impossible.

The isolators 1200 and 1250 can be constructed as matched dies separated by an isolation barrier of any suitable type, for example a capacitor, an inductor, or other isolation element. Matching of the dies can be attained by fabricating the dies on the same process, thereby enabling both balancing and matching of the dies.

Referring to FIGS. 13A, 13B, and 13C, a set of time waveforms illustrate aspects of operation of a first differentiator output signal. FIG. 13A shows an example of a data output signal and the portion of the signal that results from common-mode noise. The data output signal shows output voltage of the first differentiator output terminal, illustratively showing a 50 kV/μsec test at true ground. A single pulse is generated for the normal differential which is overlaid by the response to a normal fast transmission edge out of the first differentiator, which is a pulse. The common-mode noise signal results from capacitive mismatch, for example of about the order of one percent, and leads to some differential signal but is rejected by the differentiator and does not produce a large output pulse so the differentiator.

FIG. 13B shows results of a 50 kV/μsec slew test and indicates how two grounds can move apart. FIG. 13C illustrates differential input drive as the normal differential edge that does the transmission. The differential pulse produces a large output signal whereas the common-mode implementation leads to differential pulse due to capacitor mismatch, but with a much slower edge leading to a smaller pulse amplitude.

Terms "substantially", "essentially", or "approximately", that may be used herein, relate to an industry-accepted tolerance to the corresponding term. Such an industry-accepted tolerance ranges from less than one percent to twenty percent and corresponds to, but is not limited to, component values, integrated circuit process variations, temperature variations, rise and fall times, and/or thermal noise. The term "coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. Inferred coupling, for example where one element is coupled to another element by inference, includes direct and indirect coupling between two elements in the same manner as "coupled".

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, various aspects or portions of a communication or isolation system are described including several optional implementations for particular portions. Any suitable combination or permutation of the disclosed designs may be implemented.

What is claimed is:

1. A semiconductor device comprising:
an integrated circuit formed on a substrate and comprising a signal interface with at least one isolator capacitor, the integrated circuit comprising:
a plurality of interleaved inter-metal dielectric layers and interlayer dielectrics formed on the substrate;
a thick passivation layer formed on the plurality of the interleaved inter-metal dielectric layers and interlayer dielectrics with selected thickness of the thick passivation layer being greater than thickness sufficient for isolation so that testing for defects is eliminated; and
a thick metal layer formed on the thick passivation layer, the at least one isolator capacitor formed comprising the thick metal layer and a metal layer in the plurality of interleaved inter-metal dielectric layers and interlayer dielectrics separated by the thick passivation layer as an insulator;
the integrated circuit divided into first and second dies;
an isolation barrier between the first and second dies;
a plurality of capacitors respectively formed on separate dies;
a converter in the first die configured to track process characteristics across the isolation barrier and modify amplitude of a fast differential edge modulation as a function of speed of an active device on a transmitting side of the isolation barrier; and
a differentiator in the second die configured to differentiate the fast differential edge modulation on a receiving side of the isolation barrier whereby differentiation bandwidth tracks slope rate of the differential edge modulation.

2. The device according to claim 1 further comprising:
the differentiator comprising a calibrated capacitor that matches the capacitor plurality.

3. The device according to claim 1 further comprising:
a capacitive isolation barrier coupled between the converter and the differentiator configured for passing the fast differential edge modulation; and
the converter and differentiator configured for tracking the differentiation bandwidth and slope rate of the differential edge modulation whereby capacitor size in the isolation barrier is reduced or minimized, low frequency components in the passed fast differential edge modulation are attenuated, and common mode noise is reduced.

4. The device according to claim 1 further comprising:
a capacitive isolation barrier coupled between the converter and the differentiator comprising a plurality of inter-level metal dielectric capacitors; and
a feedback control loop configured to balance the plurality of inter-level metal dielectric capacitors.

5. The device according to claim 4 further comprising:
the capacitive isolation barrier comprising a plurality of inter-level metal dielectric capacitors formed on first and second sides of the isolation barrier from respective separate first and second integrated circuit dies from adjacent portions of a common wafer.

6. The device according to claim 1 wherein:
the thick passivation layer comprises a thick oxide layer.

7. A semiconductor device comprising:
an integrated circuit formed on a substrate and divided into at least two dies arranged across an isolation barrier, the integrated circuit comprising:
a plurality of interleaved inter-metal dielectric layers and interlayer dielectrics formed on the substrate;
a thick passivation layer formed on the plurality of interleaved inter-metal dielectric layers and interlayer dielectrics layers;
a thick metal layer formed on the thick passivation layer;
a plurality of isolator capacitors respectively formed of the thick metal layer and at least one metal layer in the interleaved inter-metal dielectric layers and interlayer dielectrics arranged as substantially parallel planes extending laterally with an overlap selected to compensate for dielectric leakage and fringe fields from creating voltage gradients, the plurality of isolator capacitors formed on separate dies from a single wafer whereby ratio of parasitic capacitance to primary capacitance is reduced; and
a plurality of metal layers distributed within silicate glass dielectric layers, separated by thin silicon nitride layers and overlying inter-layer dielectric layers;
the thick metal layer comprising a redistribution layer (RDL); and
the thick passivation layer comprising an undoped silicate glass (USG) layer.

8. The device according to claim 7 wherein:
the integrated circuit is divided into at least two dies wherein adjacent dies from the integrated circuit are arranged across the isolation barrier and capacitors are matched.

9. The device according to claim 7 wherein:
the integrated circuit is divided into at least two dies wherein adjacent dies from the integrated circuit are arranged across the isolation barrier and parts of a capacitor on different dies are formed from the same wafer and matched.

10. The device according to claim 7 wherein:
the plurality of isolator capacitors is configured comprising the thick passivation layer as an insulator whereby thickness of the passivation layer is selected to reduce parasitic capacitance and improve high-speed operation of the interface.

11. The device according to claim 7 wherein:
the plurality of isolator capacitors is configured comprising the thick passivation layer as an insulator whereby thickness of the passivation layer is selected to reduce capacitor size of the at least one isolator capacitor.

12. A method for forming a semiconductor device further comprising:
forming a plurality of interleaved inter-metal dielectric layers and interlayer dielectrics on a substrate;
forming a thick passivation layer on the plurality of interleaved inter-metal dielectric layers and interlayer dielectrics;
forming a thick metal layer on the thick passivation layer;
forming an integrated circuit on the substrate comprising a signal interface with at least one isolator capacitor;
forming the at least one isolator capacitor comprising the thick passivation layer as an insulator whereby thickness of the thick passivation layer is selected greater than thickness sufficient for isolation so that testing for defects is eliminated;
distributing the plurality of interleaved inter-metal dielectric layers and interlayer dielectrics within silicate glass dielectric layers, separated by thin silicon nitride layers and overlying inter-layer dielectric layers;
forming the thick passivation layer as an undoped silicate glass (USG) layer; and forming the thick metal layer as a redistribution layer (RDL).

13. The method according to claim 12 further comprising:
forming the at least one isolator capacitor comprising the thick passivation layer as an insulator whereby thickness of the passivation layer is selected to reduce parasitic capacitance and improve high-speed operation of the interface.

14. The method according to claim 12 further comprising:
forming the at least one isolator capacitor comprising the thick passivation layer as an insulator whereby thickness of the passivation layer is selected to reduce capacitor size of the at least one isolator capacitor.

15. The method according to claim 12 further comprising:
dividing the integrated circuit into at least two dies; and
arranging the at least two dies across an isolation barrier wherein capacitors respectively formed on separate dies are configured with a reduced ratio of parasitic capacitance to primary capacitance.

16. The method according to claim 12 further comprising:
dividing the integrated circuit into at least two dies; and
arranging adjacent dies from the integrated circuit across an isolation barrier whereby capacitors are matched.

17. The method according to claim 12 further comprising:
dividing the integrated circuit into at least two dies;
arranging adjacent dies from the integrated circuit across an isolation barrier; and
forming parts of a capacitor on different dies from the same wafer and matched.

18. A method for forming a semiconductor device further comprising:
forming a plurality of interleaved inter-metal dielectric layers and interlayer dielectrics on a substrate;
forming a thick passivation layer on the plurality of interleaved inter-metal dielectric layers and interlayer dielectrics;
forming a thick metal layer on the thick passivation layer;
forming an integrated circuit on the substrate comprising a signal interface with at least one isolator capacitor;
forming the at least one isolator capacitor comprising the thick passivation layer as an insulator whereby thickness of the thick passivation layer is selected greater than thickness sufficient for isolation so that testing for defects is eliminated;
dividing the integrated circuit into first and second dies;
forming an isolation barrier between the first and second dies;
forming a plurality of capacitors respectively on separate dies;
configuring a converter in the first die to track process characteristics across the isolation barrier and modify amplitude of a fast differential edge modulation as a function of speed of an active device on a transmitting side of the isolation barrier; and
configuring a differentiator in the second die to differentiate the fast differential edge modulation on a receiving side of the isolation barrier whereby differentiation bandwidth tracks slope rate of the differential edge modulation.

19. The method according to claim 18 further comprising:
configuring the differentiator comprising a calibrated capacitor that matches the capacitor plurality.

20. The method according to claim 18 further comprising:
forming a capacitive isolation barrier between the converter and the differentiator for passing the fast differential edge modulation; and configuring the converter and differentiator for tracking the differentiation bandwidth and slope rate of the differential edge modulation whereby capacitor size in the isolation barrier is reduced or minimized, low frequency components in the passed fast differential edge modulation are attenuated, and common mode noise is reduced.

21. The method according to claim 18 further comprising:
forming a capacitive isolation barrier between the converter and the differentiator comprising a plurality of inter-level metal dielectric capacitors; and
configuring a feedback control loop to balance the plurality of inter-level metal dielectric capacitors.

22. The method according to claim 21 further comprising:
forming the capacitive isolation barrier comprising:
forming a plurality of inter-level metal dielectric capacitors on first and second sides of the isolation barrier from respective separate first and second integrated circuit dies from adjacent portions of a common wafer.

23. The device according to claim 1 further comprising:
the thick metal layer comprising a redistribution layer (RDL); and
a metal via formed beneath the RDL that locally replaces the thick passivation layer under the RDL.

24. The device according to claim 1 further comprising:
at least one metal via formed that prevents local deposition of materials with unfavorable breakdown voltages.

25. The device according to claim 1 further comprising:
a metal via; and
a predetermined metal layer in the plurality of interleaved inter-metal dielectric layers and interlayer dielectrics underlying the metal via and extending laterally whereby lateral extension of the metal via overlaps the predetermined metal layer.

26. The device according to claim 1 wherein:
the thick metal layer is functional as a first plate and a predetermined metal layer in the plurality of interleaved inter-metal dielectric layers and interlayer dielectrics functional as a second plate in an isolation capacitor, the first plate and the second plate arranged as substantially parallel planes extending laterally with an overlap selected to compensate for dielectric leakage and fringe fields from creating voltage gradients.

27. The device according to claim 26 wherein:
the first plate and the second plate are formed with rounded or oblique angles whereby electric fields and/or voltage gradients are reduced or minimized.

28. The device according to claim 1 further comprising:
a plurality of metal layers distributed within silicate glass dielectric layers, separated by thin silicon nitride layers and overlying inter-layer dielectric layers; wherein:
the thick metal layer comprises a redistribution layer (RDL); and
the thick passivation layer comprises an undoped silicate glass (USG) layer.

29. The device according to claim 1 wherein:
the at least one isolator capacitor is configured comprising the thick passivation layer as an insulator whereby thickness of the passivation layer is selected to reduce parasitic capacitance and improve high-speed operation of the interface.

30. The device according to claim 1 wherein:
the at least one isolator capacitor is configured comprising the thick passivation layer as an insulator whereby thickness of the passivation layer is selected to reduce capacitor size of the at least one isolator capacitor.

31. The device according to claim 1 wherein:
the integrated circuit is divided into at least two dies arranged across an isolation barrier wherein capacitors respectively formed on separate dies are configured with a reduced ratio of parasitic capacitance to primary capacitance.

32. The device according to claim 1 wherein:
the integrated circuit is divided into at least two dies wherein adjacent dies from the integrated circuit are arranged across an isolation barrier and capacitors are matched.

33. The device according to claim 1 wherein:
the integrated circuit is divided into at least two dies wherein adjacent dies from the integrated circuit are arranged across an isolation barrier and parts of a capacitor on different dies are formed from the same wafer and matched.

34. The device according to claim 7 wherein: the thick metal layer and at least one metal layer in the interleaved inter-metal dielectric layers and interlayer dielectrics are formed with rounded or oblique angles whereby electric fields and/or voltage gradients are reduced or minimized.

35. The device according to claim 7 further comprising: the thick metal layer comprising a redistribution layer (RDL); and a metal via formed beneath the RDL preventing deposition of passivation.

36. The device according to claim 7 further comprising: at least one metal via formed to prevent deposition of materials with unfavorable breakdown voltages.

37. The device according to claim 7 further comprising: a metal via; and a predetermined metal layer in the plurality of interleaved inter-metal dielectric layers and interlayer dielectrics underlying the metal via and extending laterally whereby lateral extension of the metal via overlaps the predetermined metal layer.

38. The device according to claim 7 wherein: the thick passivation layer has thickness defined to be greater than thickness required for isolation so that testing for defects is eliminated.

39. The method according to claim 12 further comprising:
selecting thickness of the passivation layer to reduce parasitic capacitance.

40. The method according to claim 12 further comprising:
forming the thick metal layer as a redistribution layer (RDL); and
forming a metal via beneath the RDL.

41. The method according to claim 12 further comprising:
forming a metal via beneath the thick metal layer; and
forming at least one metal layer in selected layer(s) of the interleaved inter-metal dielectric layers and interlayer dielectrics plurality underlying the metal via and extending laterally whereby lateral extension of the metal via overlaps a predetermined metal layer.

42. The method according to claim 12 further comprising:
forming the at least one isolation capacitor as the thick metal layer functional as a first plate and a predetermined metal layer in the interleaved inter-metal dielectric layer and interlayer dielectric plurality functional as a second plate, the first plate and second plate separated by the thick passivation layer; and
arranging the first plate and the second plate as substantially parallel planes extending laterally with an overlap selected to compensate for dielectric leakage and fringe fields from creating voltage gradients.

43. The method according to claim 12 further comprising:
forming the first plate and the second plate with rounded or oblique angles whereby electric fields and/or voltage gradients are reduced or minimized.

44. The method according to claim 12 further comprising:
forming at least one metal via that prevents local deposition of materials with unfavorable breakdown voltages.

* * * * *